(12) United States Patent
Laven et al.

(10) Patent No.: US 11,398,472 B2
(45) Date of Patent: Jul. 26, 2022

(54) RC IGBT WITH AN IGBT SECTION AND A DIODE SECTION

(71) Applicant: Infineon Technologies AG, Neubiberg (DE)

(72) Inventors: Johannes Georg Laven, Taufkirchen (DE); Roman Baburske, Otterfing (DE); Frank Dieter Pfirsch, Munich (DE); Alexander Philippou, Munich (DE); Christian Philipp Sandow, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/016,498

(22) Filed: Sep. 10, 2020

(65) Prior Publication Data
US 2021/0083081 A1    Mar. 18, 2021

(30) Foreign Application Priority Data
Sep. 17, 2019    (DE) .......................... 102019125007.2

(51) Int. Cl.
| | | |
|---|---|---|
| *H01L 27/02* | (2006.01) | |
| *H01L 27/07* | (2006.01) | |
| *H01L 29/739* | (2006.01) | |
| *H01L 29/66* | (2006.01) | |
| *H01L 29/08* | (2006.01) | |
| *H01L 21/225* | (2006.01) | |
| *H01L 29/861* | (2006.01) | |
| *H01L 21/265* | (2006.01) | |
| *H01L 21/033* | (2006.01) | |
| *H01L 21/8234* | (2006.01) | |

(52) U.S. Cl.
CPC ...... *H01L 27/0716* (2013.01); *H01L 21/0337* (2013.01); *H01L 21/2253* (2013.01); *H01L 21/26506* (2013.01); *H01L 21/823487* (2013.01); *H01L 29/083* (2013.01); *H01L 29/66333* (2013.01); *H01L 29/7397* (2013.01); *H01L 29/861* (2013.01)

(58) Field of Classification Search
CPC ............ H01L 29/7397; H01L 27/0716; H01L 29/66333; H01L 29/083; H01L 27/0727; H01L 29/0834; H01L 29/0696; H01L 29/407; H01L 29/8613; H01L 29/417; H01L 29/7393; H01L 29/66348; H01L 27/0664; H01L 29/861; H01L 29/0619; H01L 29/7395; H01L 21/2253; H01L 21/26506; H01L 27/0629; H01L 29/8083; H01L 21/0337; H01L 21/823487; H01L 2224/49175; H01L 25/072; H01L 25/18; H01L 27/0255; H01L 27/0711; H01L 21/426
See application file for complete search history.

(56) References Cited

U.S. PATENT DOCUMENTS

| 2013/0001639 | A1* | 1/2013 | Iwasaki | H01L 27/0761 |
| | | | | 257/140 |
| 2014/0361333 | A1* | 12/2014 | Kimura | H01L 27/0664 |
| | | | | 257/140 |

(Continued)

*Primary Examiner* — Shouxiang Hu
(74) *Attorney, Agent, or Firm* — Murphy, Bilak & Homiller, PLLC

(57) ABSTRACT

An RC IGBT with an n-barrier region in a transition section between a diode section and an IGBT section is presented.

22 Claims, 17 Drawing Sheets

(56) References Cited

U.S. PATENT DOCUMENTS

2015/0155277 A1* 6/2015 Ogura ................. H01L 29/1095
　　　　　　　　　　　　　　　　　　　　　　　257/140
2018/0190650 A1* 7/2018 Laven ................. H01L 29/0834
2019/0067463 A1　2/2019 Abe et al.

* cited by examiner

FIG 4
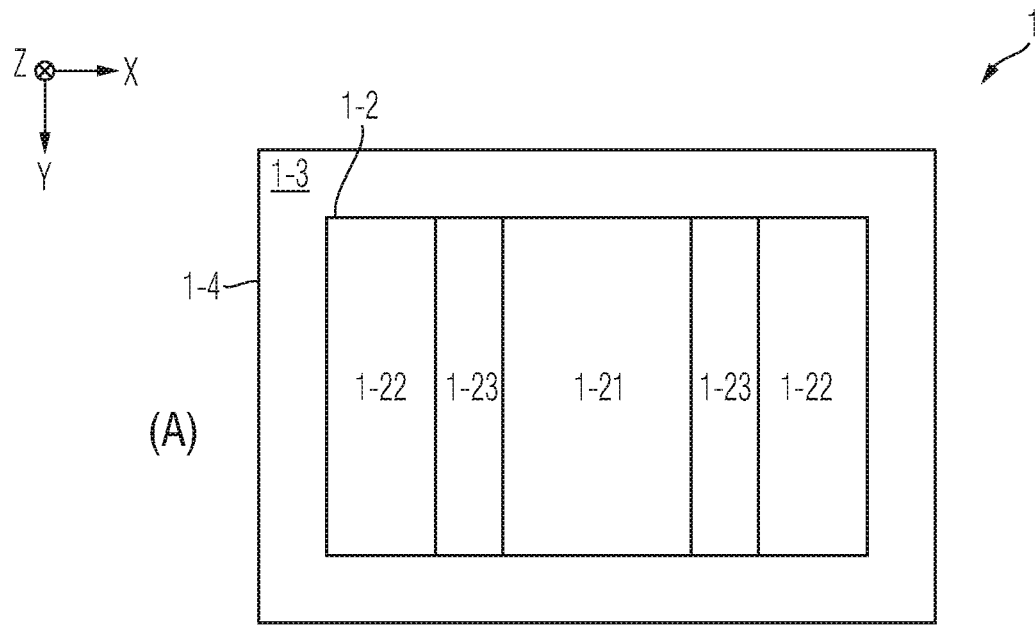
(A)
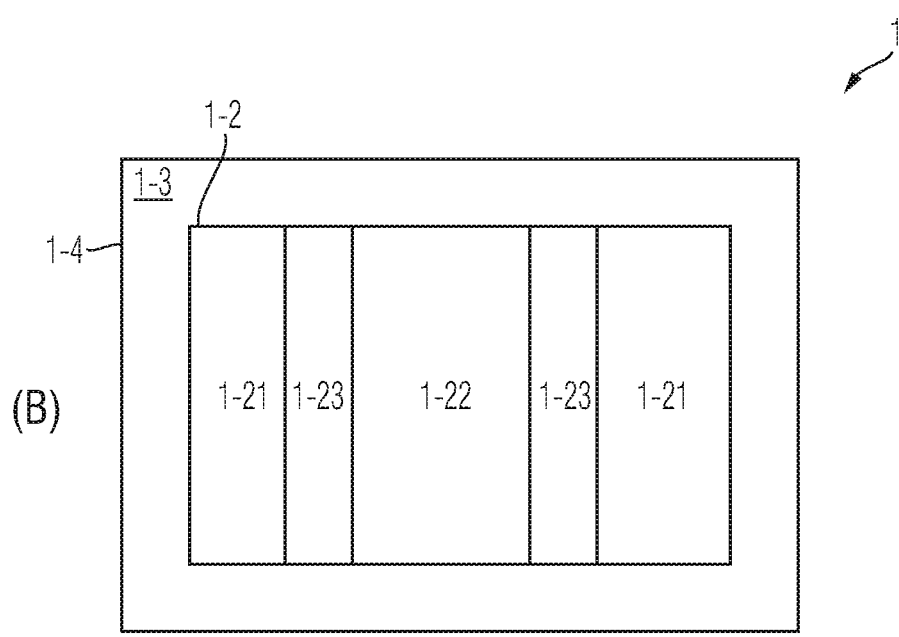
(B)

FIG 4 (CONTINUED)
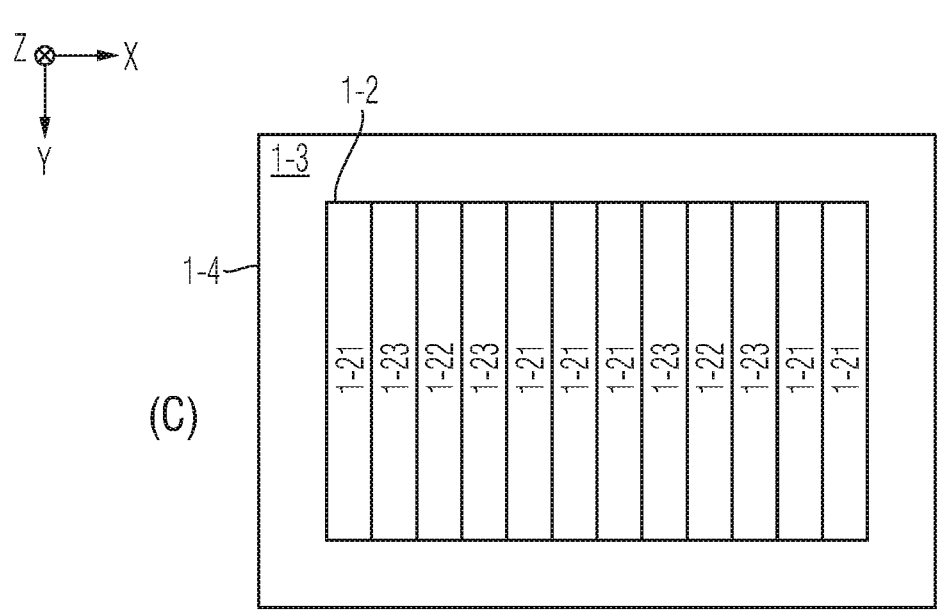
(C)
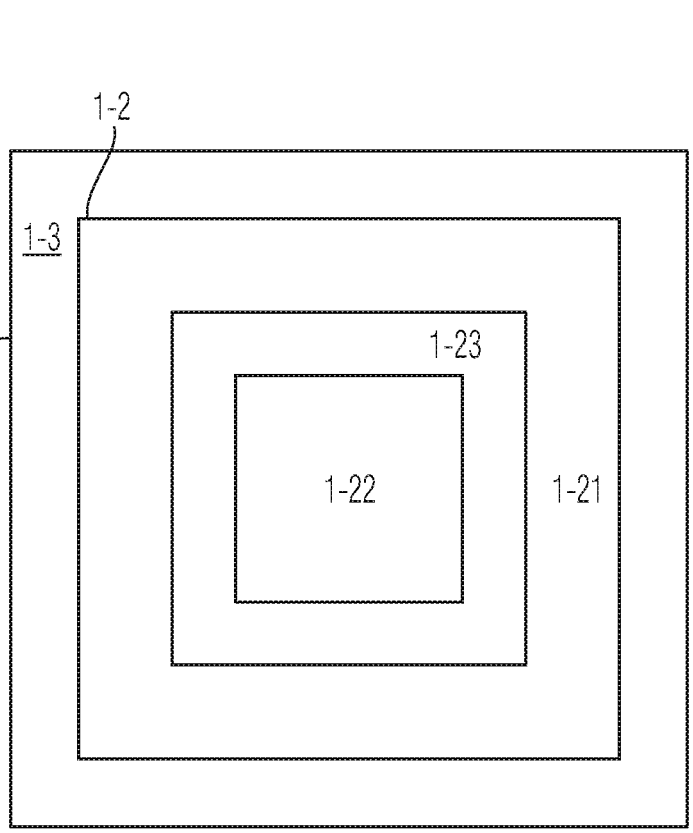
(D)

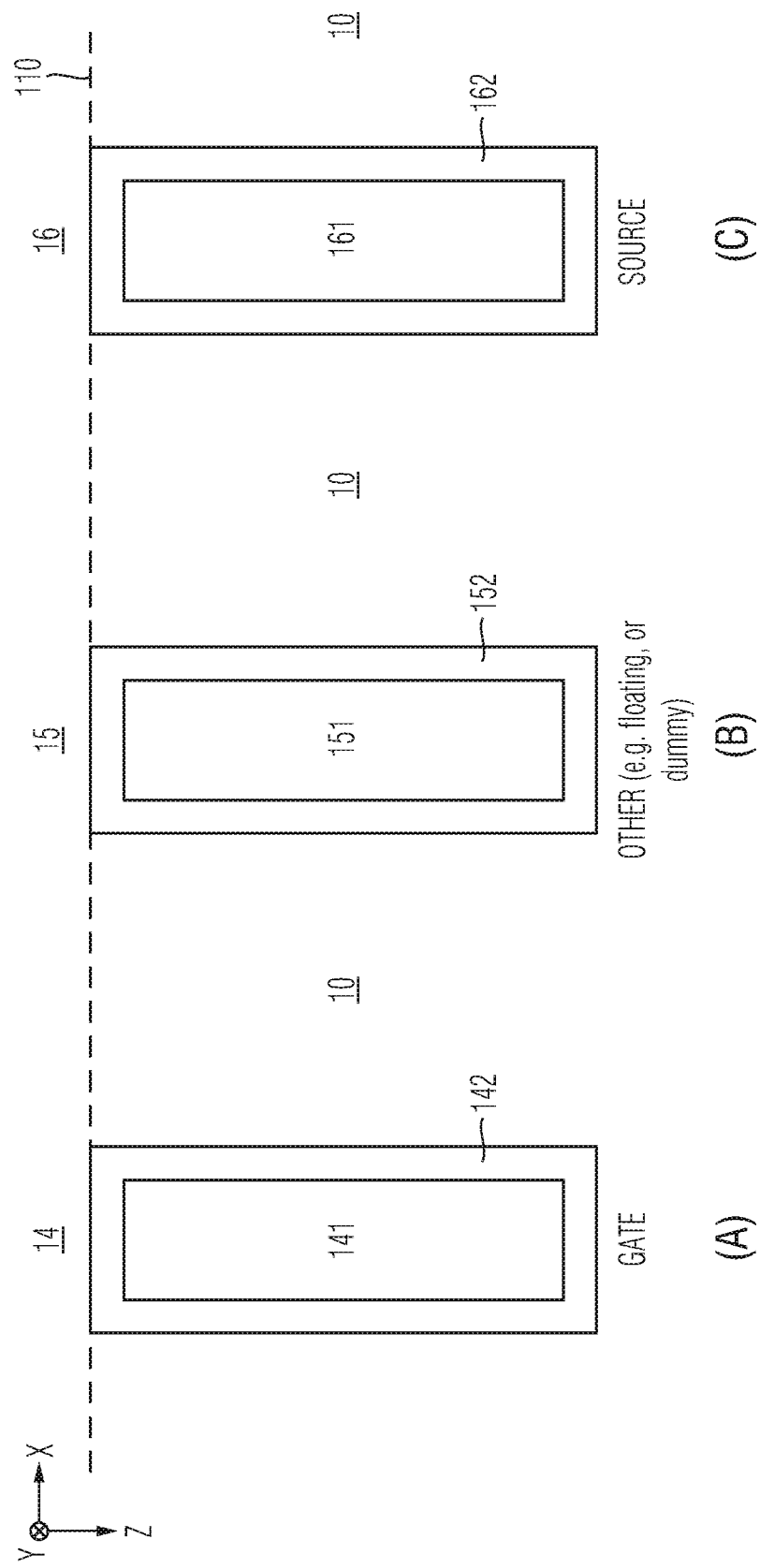

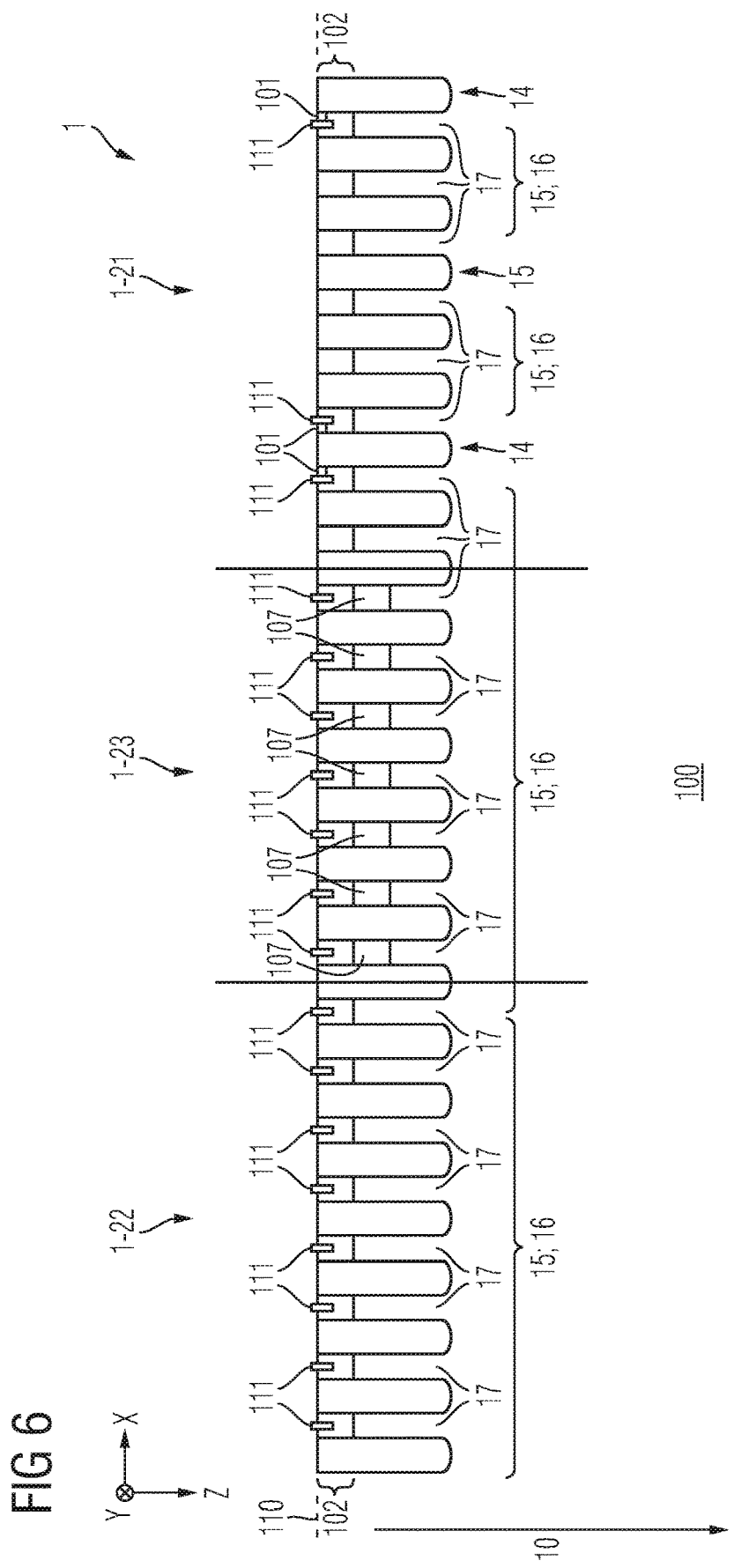

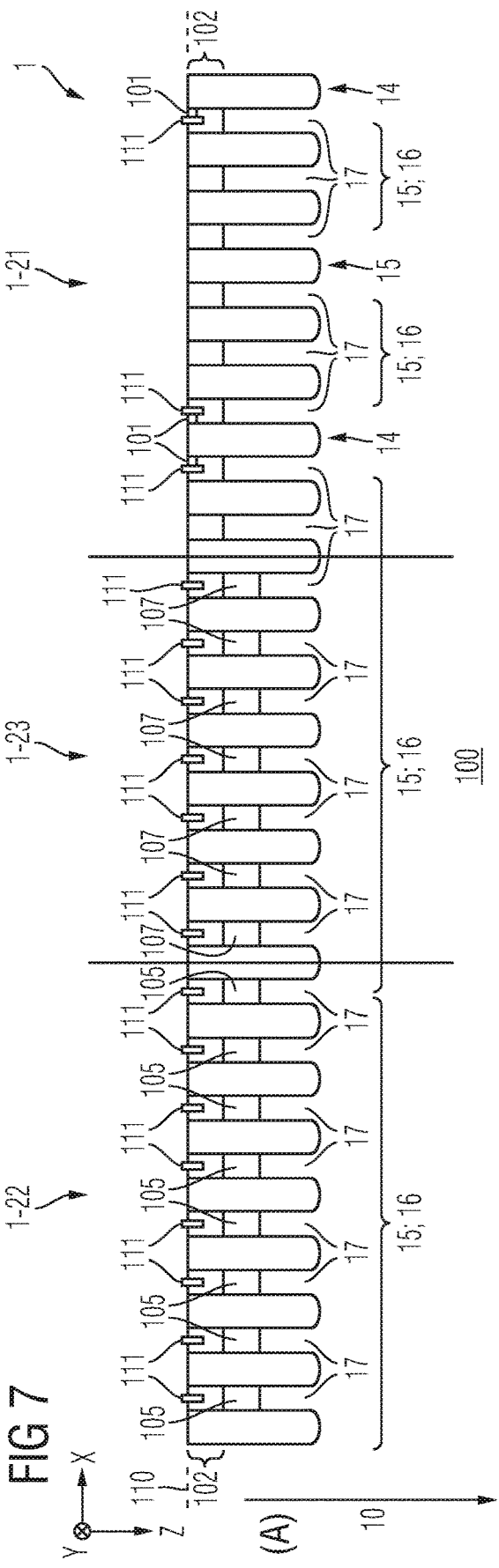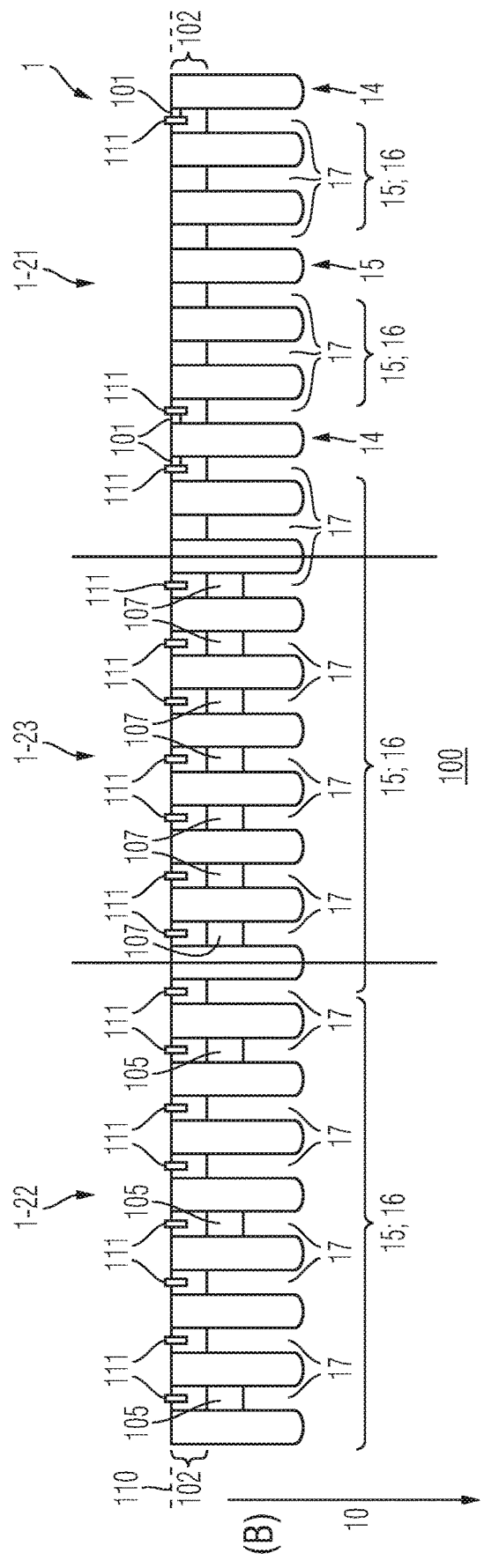

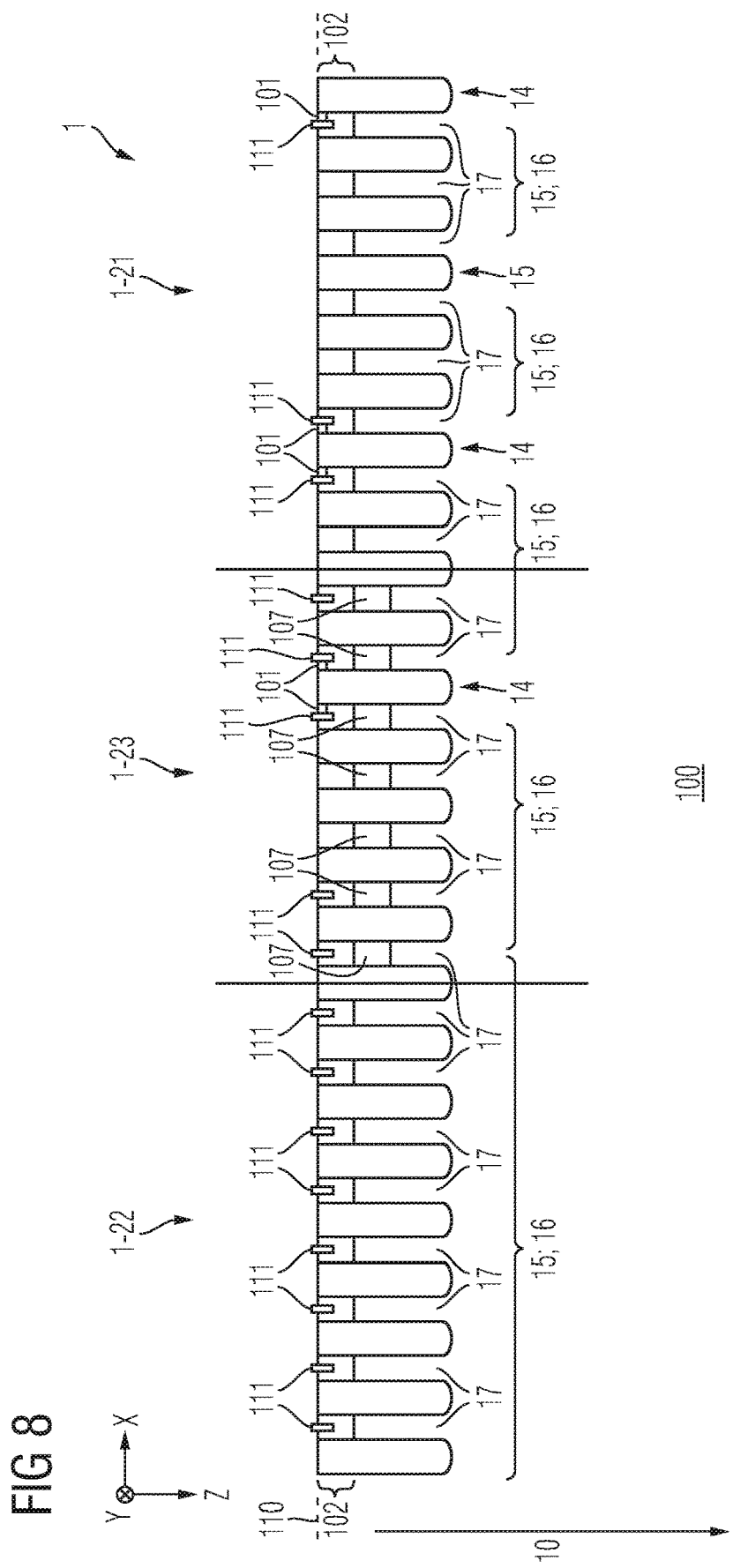

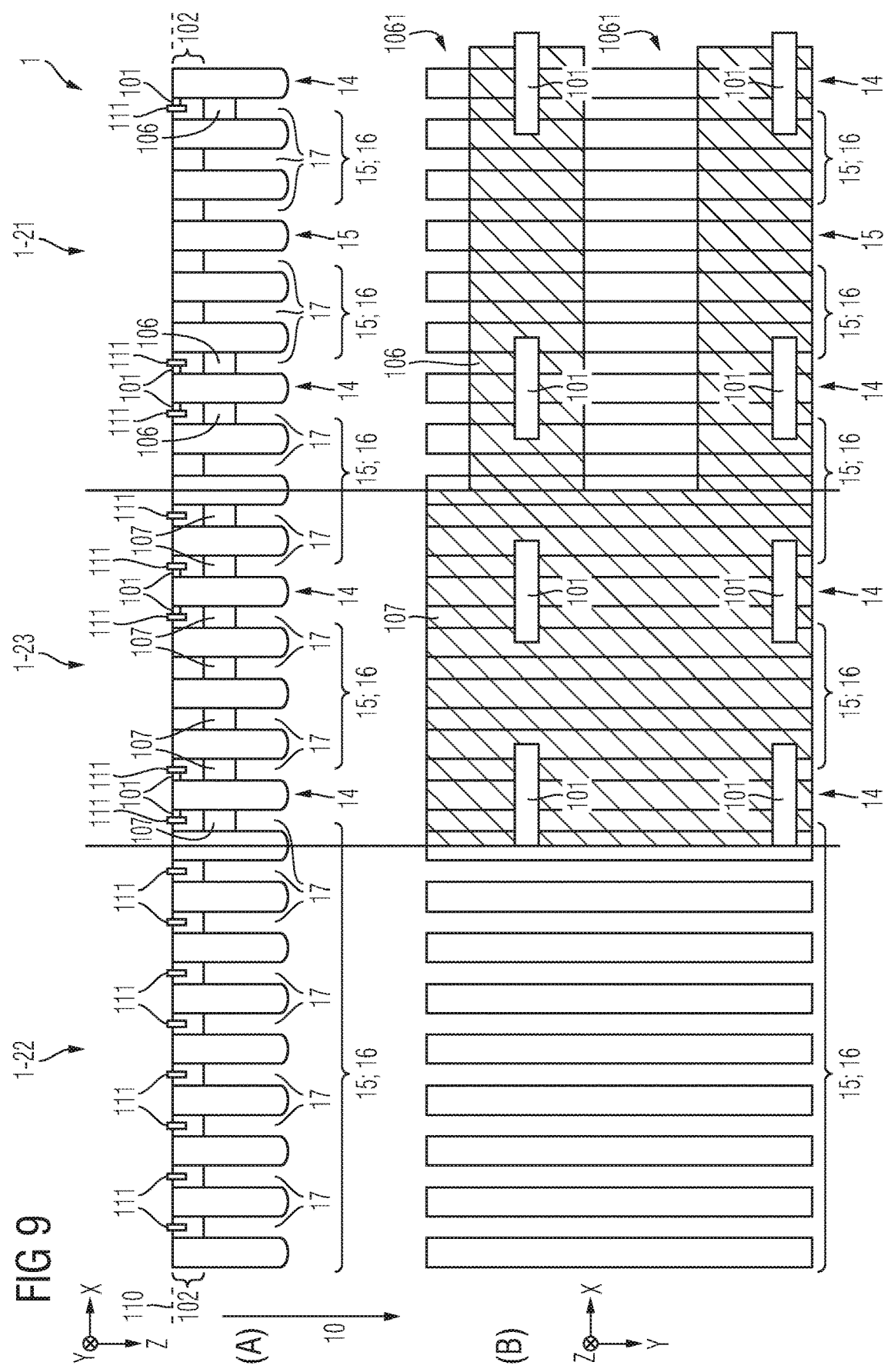

FIG 10
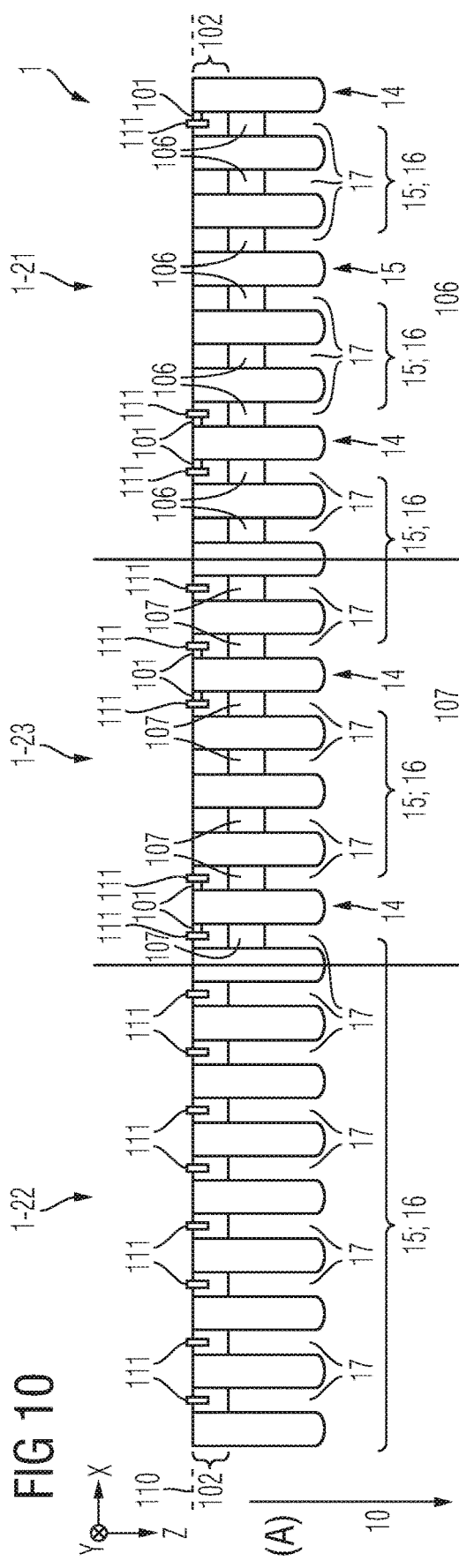
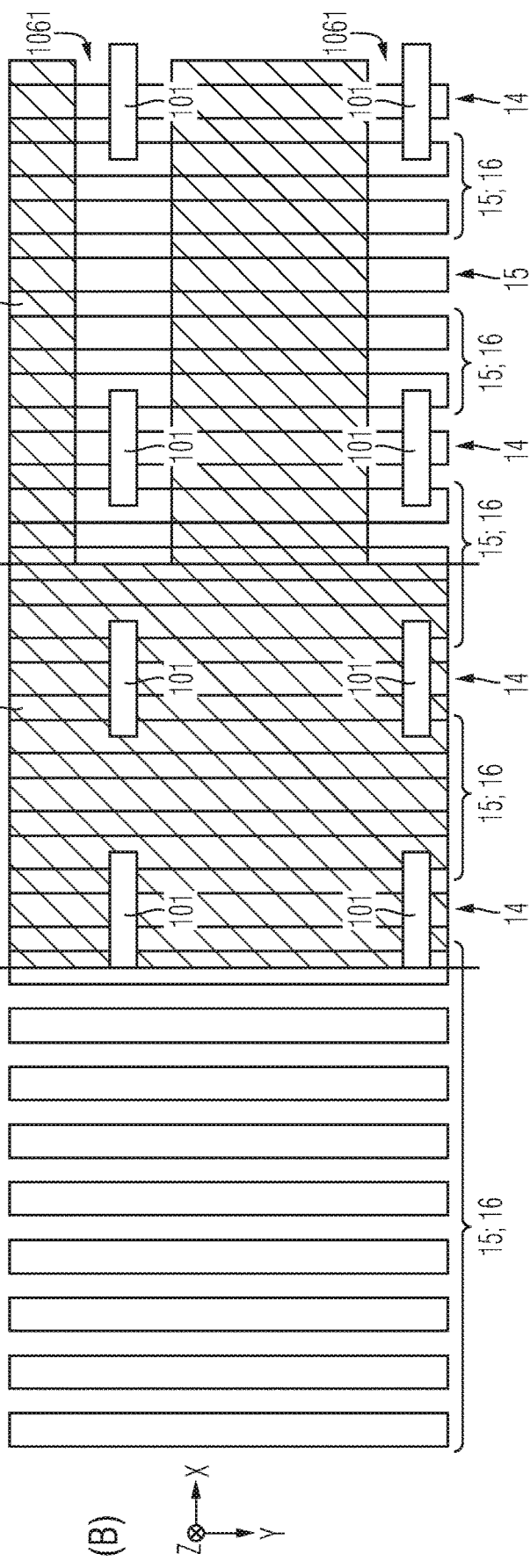

FIG 11
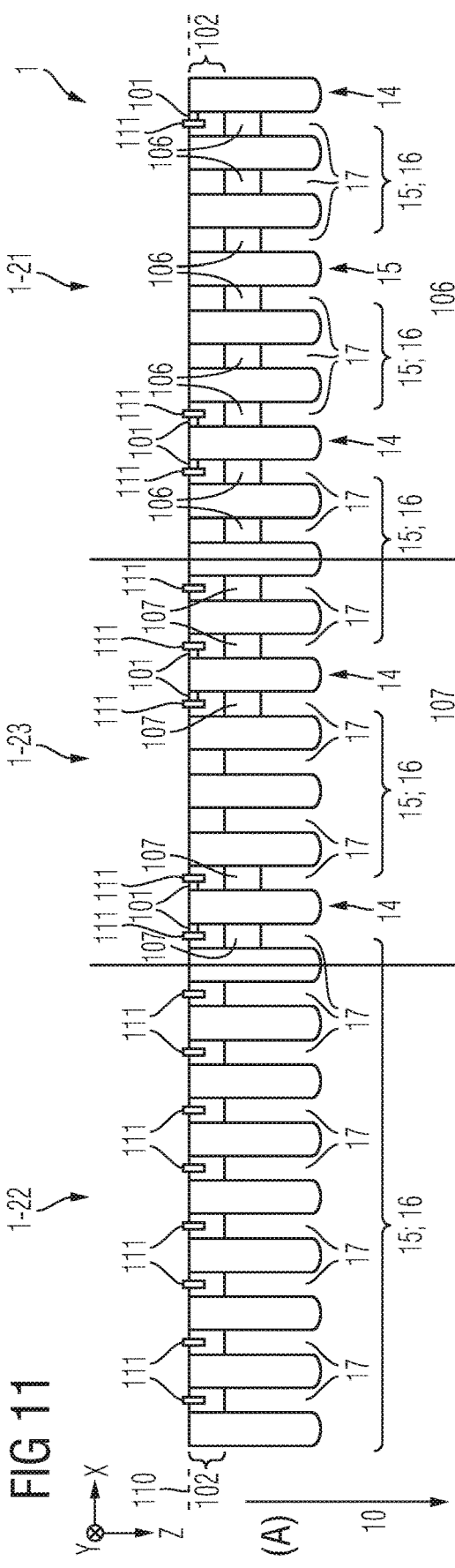
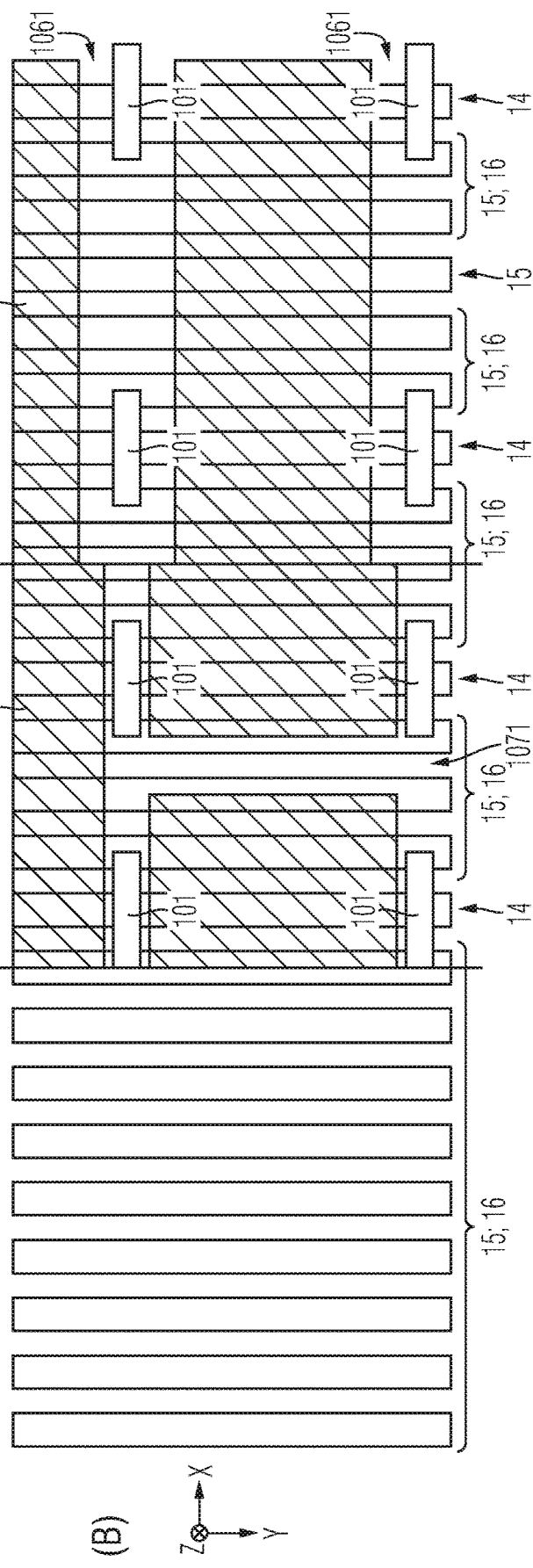

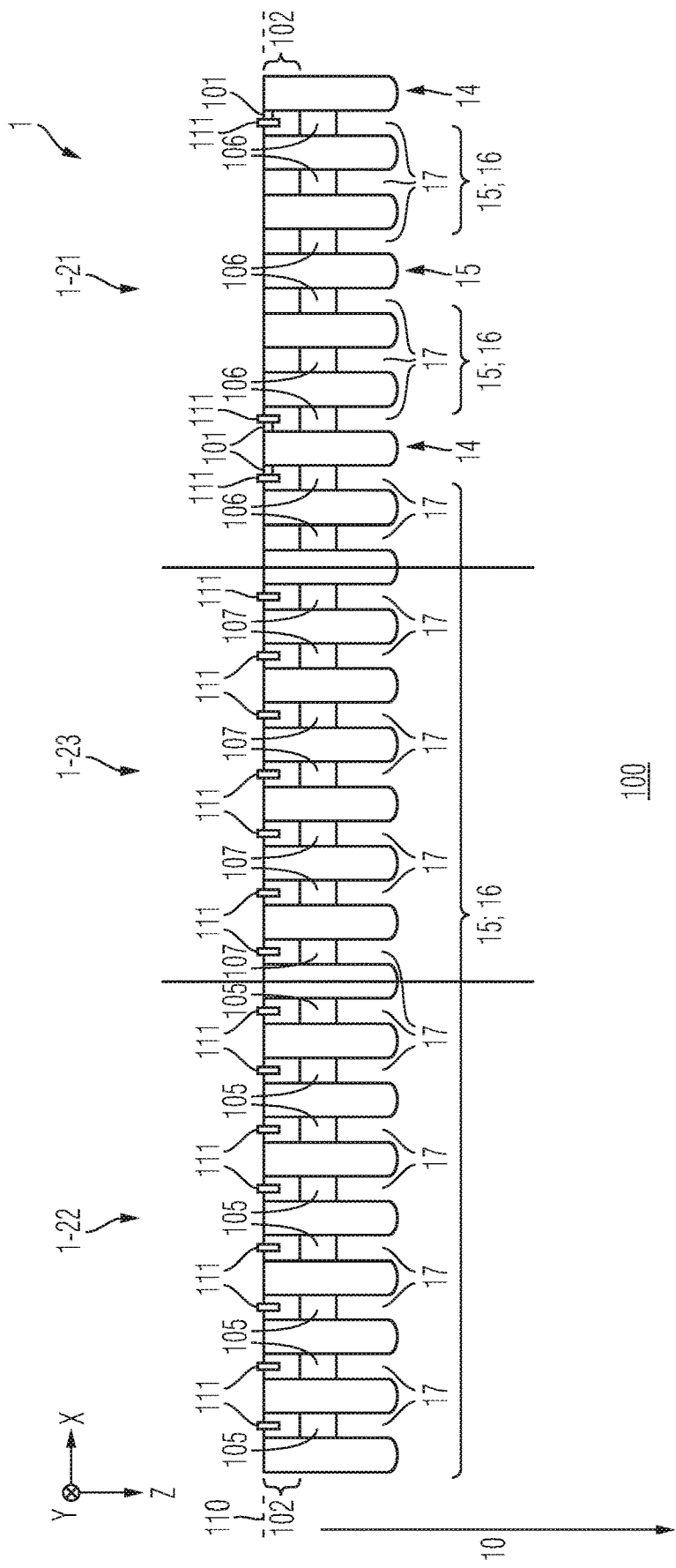

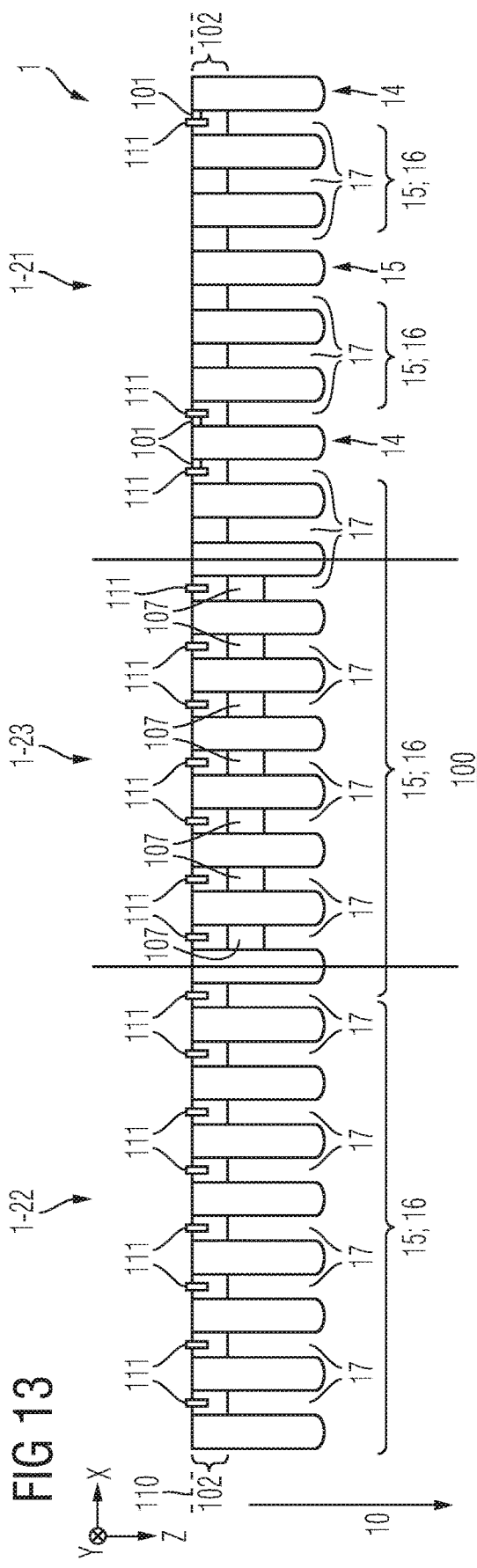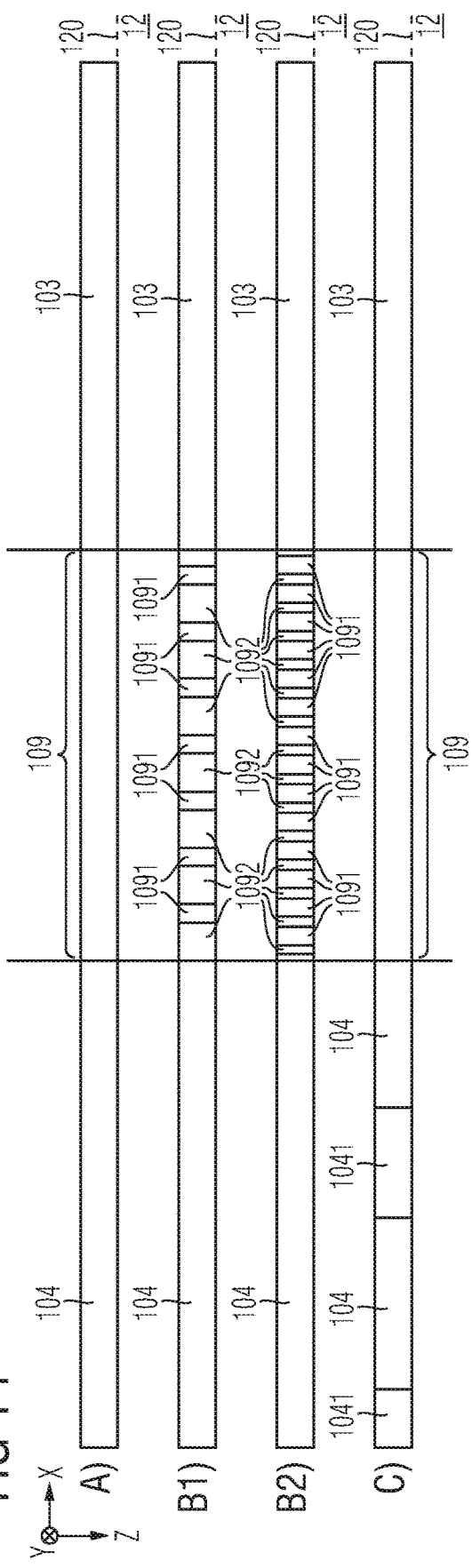

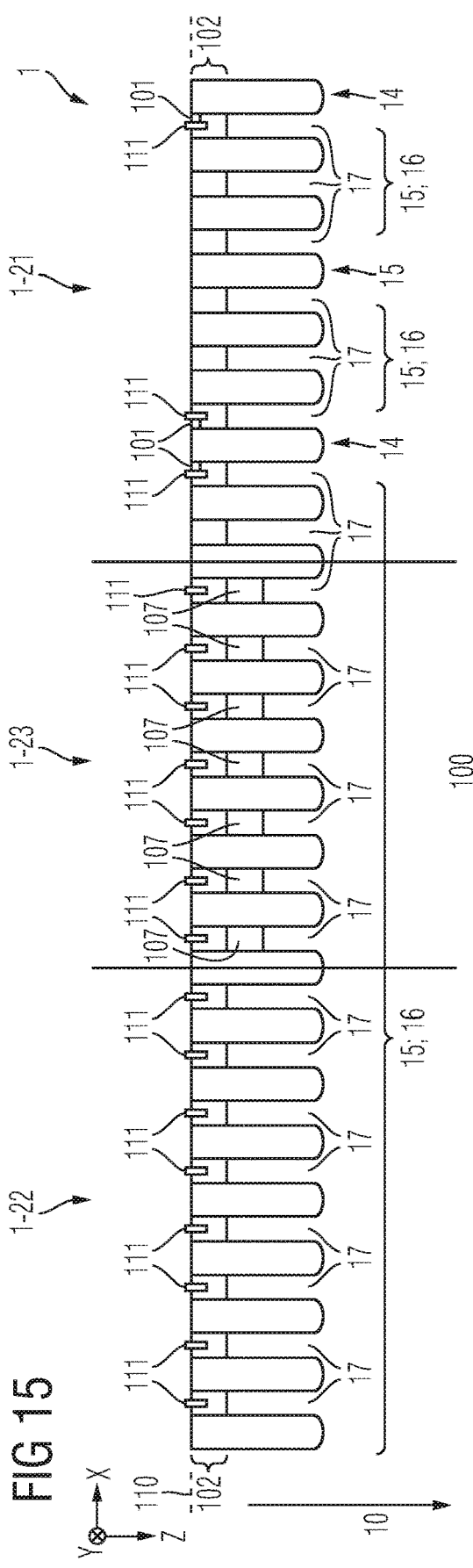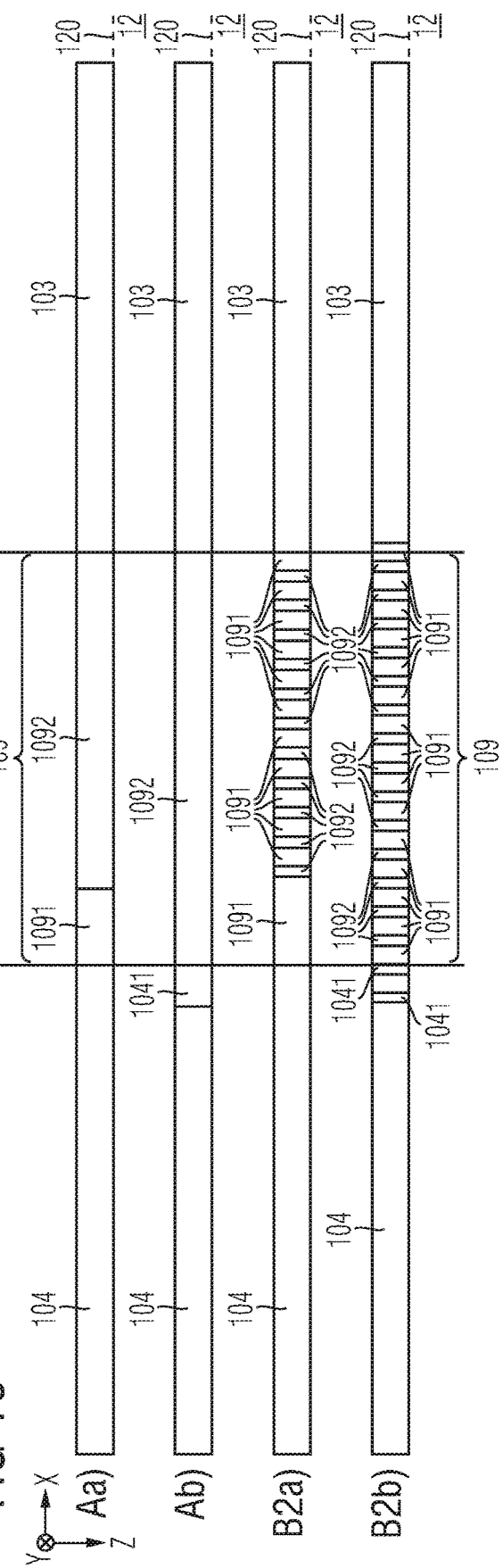

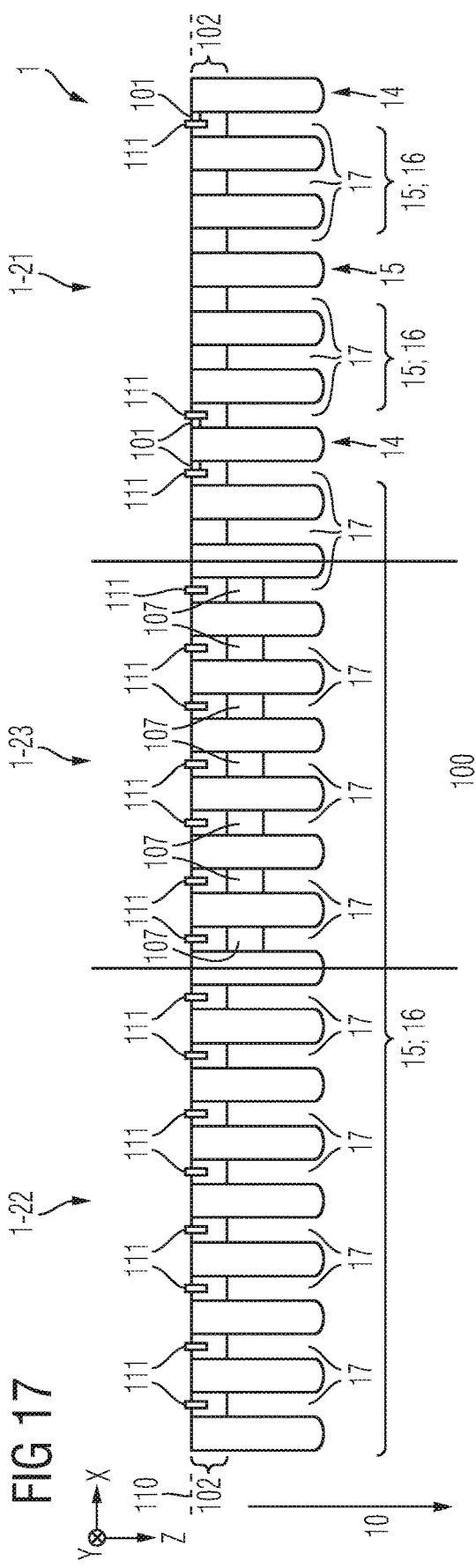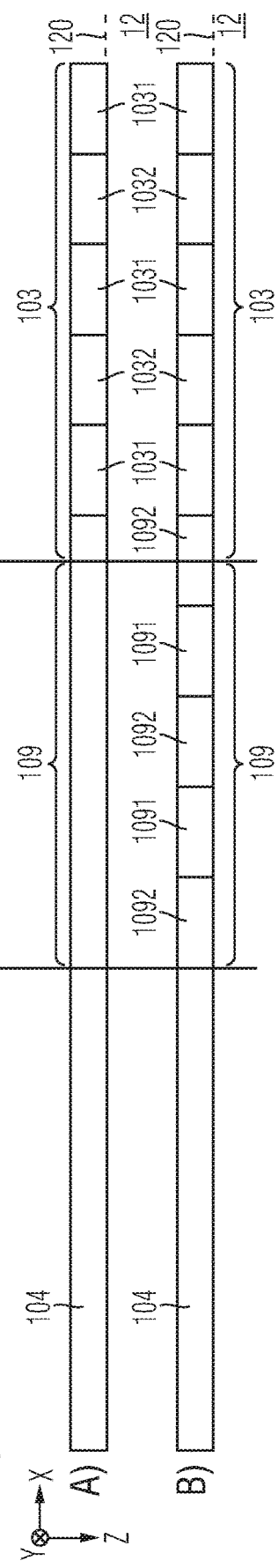

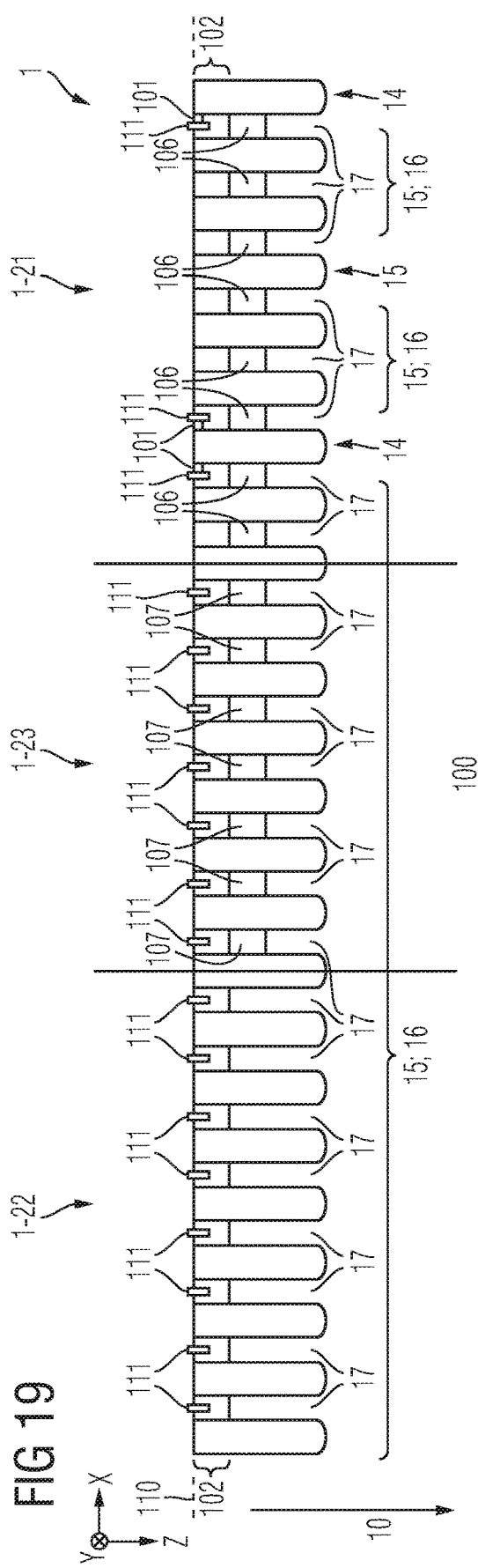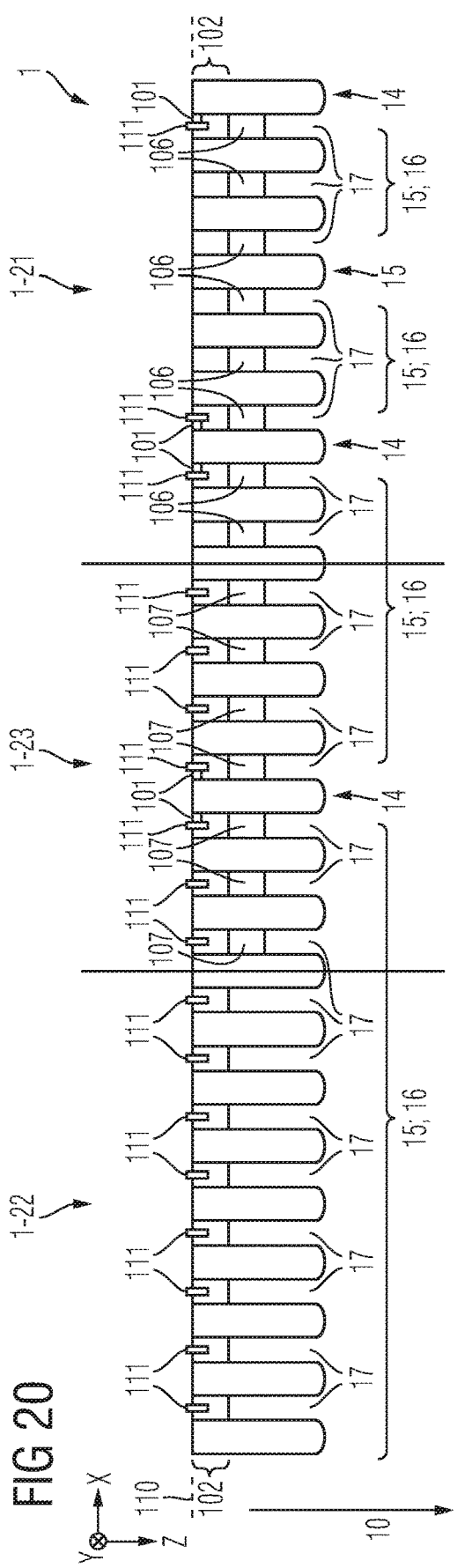

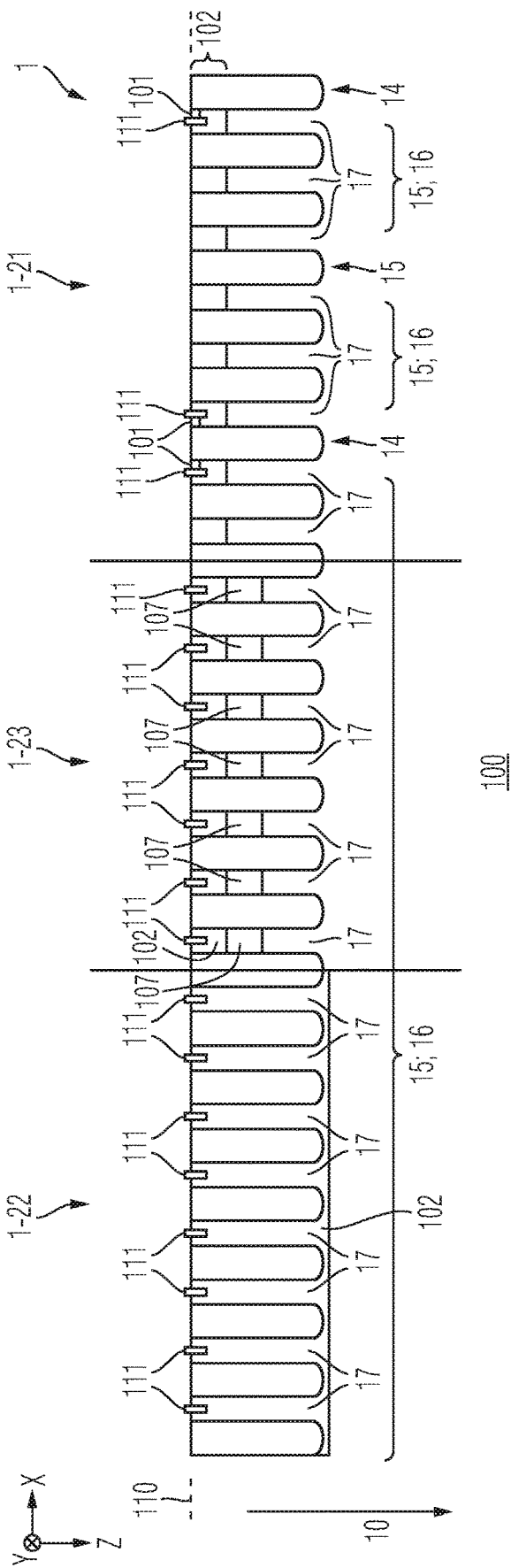

RC IGBT WITH AN IGBT SECTION AND A DIODE SECTION

TECHNICAL FIELD

This specification refers to embodiments of an RC IGBT and to embodiments of a method of forming an RC IGBT. In particular, the specification is related to embodiments of an RC IGBT and to embodiments of a method of forming an RC IGBT where an n-barrier region is provided in a transition section between a diode section and an IGBT section.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

Some power semiconductor device further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and revers load current capability is the reverse conducting (RC) IGBT, the general configuration of which is known to the skilled person. Typically, for an RC IGBT, the forward conducting state is controllable by means of providing a corresponding signal to the gate electrodes, and the reverse conducting state is typically not controllable, but the RC IGBT assumes the reverse conducting state if a reverse voltage is present at the load terminals due to a corresponding diode structure in the RC IGBT.

It is desirable to provide an RC IGBT with a high degree of controllability and robustness in addition to a high efficiency in terms of power losses.

SUMMARY

Aspects described herein relate to embodiments of an RC IGBT and embodiments of a method of forming an RC IGBT where an n-barrier region is provided in a transition section between a diode section and an IGBT section. Exemplary configurations of the n-barrier may allow for Qrr reduction, in particular when the RC IGBT is employed in drive applications which require fast switching capability and short-circuit ruggedness. For example, during a short-circuit in the IGBT section(s), the RC IGBT typically gets hottest in the center regions of the IGBT section(s), while the diode section(s) do not see any currents, and may cool the IGBT section(s), which improves the short-circuit-ruggedness of the RC IGBT. The stronger the integration of the diode, the higher the improvement potential with respect to the short-circuit ruggedness of the IGBT. However, a strong diode integration may become limiting in the reduction of power losses due to strong increase of the amount of charge carriers in the part of the IGBT section close to the diode region right before reverse recovery if the gate potential switches from on-state value (e.g. 15V) to a value below the threshold voltage of the IGBT MOS-structure (e.g. 0V, −8V, −15V) to avoid a short-circuit of the dc-link. At the same time, a fine pattern of p-n-structures can be placed at the backside of the transition section, which suppress the charge carrier injection during on-state and reverse recovery.

According to an embodiment, an RC IGBT comprises: an active region with an IGBT section, a diode section and a transition section between the IGBT section and the diode section, wherein the IGBT section and the diode section adjoin the transition section from opposing lateral directions; an edge termination region surrounding the active region; a semiconductor body having a frontside and a backside, a thickness of the semiconductor body being defined as the distance along a vertical direction between the frontside and the backside, wherein a total lateral extension of the transition section amounts to at least 30% of the semiconductor body thickness; a plurality of trenches arranged in each of the IGBT section, the diode section and the transition section, each trench extending from the frontside along the vertical direction into the semiconductor body and comprising a trench electrode isolated from the semiconductor body by a trench insulator, wherein two adjacent trenches define a respective mesa portion in the semiconductor body; a first load terminal at the semiconductor body frontside and a second load terminal at the semiconductor body backside. The IGBT section is configured for conduction of a forward load current between the first load terminal and the second load terminal. The diode section is configured for conduction of a reverse load current between the first load terminal and the second load terminal. The RC IGBT further comprises a control terminal for controlling the forward load current, wherein, in the IGBT section, the average density of trench electrodes electrically connected to the control terminal is at least twice as great as the average density of trench electrodes connected to the control terminal in the transition section. The RC IGBT further comprises a drift region of a first conductivity type formed in the semiconductor body and extending into each of the IGBT section, the diode section and the transition section; and a body region of a second conductivity type formed in the mesa portions of the semiconductor body and extending into each of the IGBT section, the diode section and the transition section. At least portions of the body region are electrically connected to the first load terminal, wherein the body region forms pn-junctions to subsections of the mesa portions of the first conductivity type at least in the transition section. At least in the transition section, a barrier region of the first conductivity having a peak dopant concentration at least 100 times greater than an average dopant concentration of the drift region is arranged at least in portions of the mesa portions. The average dopant dose of the mesa subportions in the transition section is at least a factor of 1.2 higher than the average dopant dose of mesa subportions in the diode section.

According to another embodiment, a method of forming an RC IGBT comprises forming the following components: an active region with an IGBT section, a diode section and a transition section between the IGBT section and the diode section, wherein the IGBT section and the diode section adjoin the transition section from opposing lateral directions; an edge termination region surrounding the active region; a semiconductor body having a frontside and a backside, a thickness of the semiconductor body being defined as the distance along a vertical direction between the frontside and the backside, wherein a total lateral extension of the transition section amounts to at least 30% of the semiconductor body thickness; a plurality of trenches arranged in each of the IGBT section, the diode section and the transition section, each trench extending from the frontside along the vertical direction into the semiconductor body and comprising a trench electrode isolated from the semiconductor body by a trench insulator, wherein two adjacent trenches define a respective mesa portion in the semiconductor body; a first load terminal at the semiconductor body frontside and a second load terminal at the semiconductor body backside. The IGBT section is configured for conduction of a forward load current between the first load terminal and the second load terminal. The diode section is configured for conduction of a reverse load current between the first load terminal and the second load terminal. The method further comprises forming a control terminal for controlling the forward load current, wherein, in the IGBT section, the average density of trench electrodes electrically connected to the control terminal is at least twice as great as the average density of trench electrodes connected to the control terminal in the transition section. The method further comprises forming a drift region of a first conductivity type in the semiconductor body and extending into each of the IGBT section, the diode section and the transition section; and a body region of a second conductivity type formed in the mesa portions of the semiconductor body and extending into each of the IGBT section, the diode section and the transition section. At least portions of the body region are electrically connected to the first load terminal, wherein the body region forms pn-junctions to subsections of the mesa portions of the first conductivity type at least in the transition section. The method further comprises, forming, at least in the transition section, a barrier region of the first conductivity having a peak dopant concentration at least 100 times greater than an average dopant concentration of the drift region and arranged at least in portions of the mesa subportions. The average dopant dose of the mesa subportions in the transition section is at least a factor of 1.2 higher than the average dopant dose of mesa subportions in the diode section.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 4 schematically and exemplarily illustrates some variants, in a respective horizontal projection, of one or more diode sections and one or more IGBT sections of an RC IGBT in accordance with one or more embodiments;

FIG. 5 schematically and exemplarily illustrates vertical cross sections of different trench types that may be part of an RC IGBT in accordance with one or more embodiments;

FIGS. 6-8 each schematically and exemplarily illustrate a section of a vertical cross section of an RC IGBT in accordance with some embodiments;

FIGS. 9-11 each schematically and exemplarily illustrate a section of a vertical cross section and an associated section of a horizontal projection of an RC IGBT in accordance with some embodiments;

FIGS. 12-13 both schematically and exemplarily illustrate a section of a vertical cross section of an RC IGBT in accordance with some embodiments;

FIG. 14 schematically and exemplarily illustrates a section of a vertical cross section of some exemplary configurations a backside of an RC IGBT in accordance with some embodiments;

FIG. 15 schematically and exemplarily illustrates a section of a vertical cross section of an RC IGBT in accordance with one or more embodiments;

FIG. 16 schematically and exemplarily illustrates a section of a vertical cross section of some exemplary configurations a backside of an RC IGBT in accordance with some embodiments;

FIG. 17 schematically and exemplarily illustrates a section of a vertical cross section of an RC IGBT in accordance with one or more embodiments;

FIG. 18 schematically and exemplarily illustrates a section of a vertical cross section of some exemplary configurations a backside of an RC IGBT in accordance with some embodiments; and FIGS. 19-21 each schematically and exemplarily illustrate a section of a vertical cross section of an RC IGBT in accordance with some embodiments.

DETAILED DESCRIPTION

Figure 1:
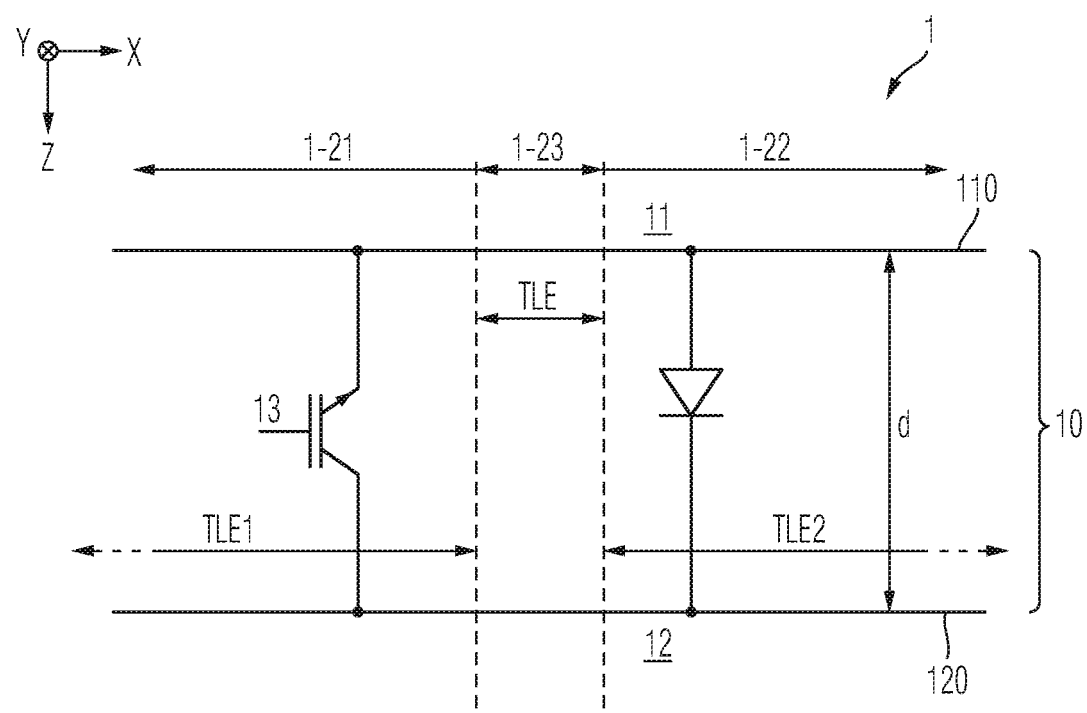
FIG. 1 schematically and exemplarily illustrates a simplified design of an RC IGBT in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, an RC IGBT exhibiting a stripe cell configuration, e.g., an RC IGBT that may be used within a power converter or a power supply. Thus, in an embodiment, such RC IGBT can be configured to carry a load current that is to be fed to a load and/or, respectively, that is provided by a power source. For example, the RC IGBT may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged with an active region of the RC IGBT.

The term "RC IGBT" as used in this specification intends to describe a RC IGBT on a single chip with high voltage blocking and/or high current-carrying capabilities. In other words, embodiments of the RC IGBT described herein are single chip RC IGBTs configured for high current, typically in the Ampere range, e.g., up to several Ampere or up to several ten or hundred Ampere, and/or high voltages, typically 100 V and above, e.g., up to at least 400 V or even more, e.g., up to at least 3 kV, or even up to 10 kV or more.

For example, the RC IGBT described below may be single chip RC IGBT exhibiting a stripe cell configuration and configured to be employed as a power component in a low-, medium- and/or high voltage application. Several single chip RC IGBTs may be integrated in a module so as to form an RC IGBT module, e.g., an RC IGBT module for installation and use in a low-, medium- and/or high voltage application, such as major home appliances, general purpose drive, electric-drive train, servo drives, traction, higher power transmission facilities, etc.

For example, the term "RC IGBT" as used in this specification is not directed to a logic semiconductor device used for, e.g., storing data, computing data and/or other types of semiconductor based data processing.

FIG. 1 schematically and exemplarily illustrates, in a simplified manner, an RC IGBT 1 in accordance with one or more embodiments. For describing the configuration of the RC IGBT 1, it will also be referred to FIGS. 2-4 in the following.

The RC IGBT 1 comprises an active region 1-2 with an IGBT section 1-21, a diode section 1-22 and a transition section 1-23 between the IGBT section 1-21 and the diode section 1-22. The IGBT section 1-21 and the diode section 1-22 adjoin the transition section 1-23 from opposing lateral directions (e.g., the diode section 1-22 along the first lateral direction X and the IGBT section 1-21 against the first lateral direction X). As illustrated in FIG. 4, the RC IGBT 1 can comprise a plurality of substantially equally configured IGBT sections 1-21, a plurality of substantially equally configured diode sections 1-22, and a plurality of substantially equally configured transition sections 1-23. The different sections 1-21, 1-22 and 1-23 may be laterally distributed within the active region 1-2, a few schematic examples being illustrated in FIG. 4. For example, the active region 1-2 consists of these sections 1-21, 1-22 and 1-23.

In accordance with variant (A) of FIG. 4, there is one centrally arranged IGBT section 1-21, with two transition sections 1-23 and two diode sections 1-22 arranged to the left and right (with respect to the first lateral direction X) in the active region 1-2. In accordance with variant (B) of FIG. 4, there is one centrally arranged diode section 1-22, two transition sections 1-23 and two IGBT sections 1-21 arranged to the left and right (with respect to the first lateral direction X) in the active region 1-2. In accordance with variant (C) of FIG. 4, there are a plurality of IGBT sections 1-21, a plurality of diode sections 1-22 and a plurality of transition sections 1-23 provided in the active region 1-2. Of course, there can be more sections 1-23, 1-22 and/or 1-21 in the active region 1-2 than illustrated in FIG. 4 (C). In accordance with variant (D) of FIG. 4, there is one centrally arranged diode section 1-22, with one frame like transition section 1-23 that surrounds the diode section 1-22 and one IGBT section 1-21 surrounding the transition section 1-23 in the active region 1-2.

Irrespective of the chosen lateral-spatial distribution of the IGBT sections 1-21, diode sections 1-22 and corresponding transition sections, it may be ensured that, with respect to a volume of the active region 1-2, the ratio between the IGBT section(s) 1-21 and the diode section(s) 1-22 is at least 1:1, or respectively, at least 2:1, i.e., larger or equal than 2:1. The chosen ratio may depend on the application in which the RC IGBT is employed. In an embodiment, at least 50% of the total volume of the active region 1-2 may be occupied for forming the IGBT section(s), and the remaining 50% (or a lower percentage share) of the active region 1-2 may be employed for forming the diode section(s) 1-22 and the transition section(s) 1-23. Irrespective of the chosen lateral-spatial distribution of the IGBT sections 1-21, diode sections 1-22 and corresponding transition sections, it may be ensured that, with respect to a volume of the active region 1-2, the ratio between the IGBT section(s) 1-21 and the diode section(s) 1-22 is even larger than 3:1.

In the following, reference will be made to "the" diode section 1-22, "the" IGBT section 1-21 and "the" transition section 1-23. It shall be understood that the explanation provided below with respect to these sections 1-21, 1-22 and 1-23 may apply to each section 1-21, 1-22 or, respectively, 1-23 that are provided in the active region 1-2. For example, if a plurality of IGBT sections 1-21 is provided, each IGBT section 1-21 may be equally configured (wherein, for example, the IGBT sections 1-21 may differ in total lateral extension or exhibit identical total lateral extensions). Accordingly, if a plurality of diode sections 1-22 is provided, each diode section 1-22 may be equally configured (wherein, for example, the diode sections 1-22 may differ in total lateral extension or exhibit identical total lateral extensions). Accordingly, if a plurality of transition sections 1-23 is provided, each transition section 1-23 may be equally configured (wherein, for example, the transition sections 1-23 may differ in total lateral extension or exhibit identical total lateral extensions).

An edge termination region 1-3 surrounds the active region 1-2. Hence, the edge termination region 1-3 is arranged external of the active region 1-2. The edge termination region 1-3 is laterally terminated by an edge 1-4. The edge 1-4 may form the chip edge of the RC IGBT 1.

As used herein, the terms "edge termination region" and "active region" are both associated with the respective technical meaning the skilled person typically associates therewith in the context of RC IGBTs. That is, the active region 1-2 is primarily configured for forward and reverse load current conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification primarily relates to the active region 1-2.

Focusing again on FIG. 1, a semiconductor body 10 of the RC IGBT 1 has a frontside 110 and a backside 120. The frontside 110 and the backside 120 may vertically terminate the semiconductor body 10. Hence, a thickness d of the semiconductor body 10 is defined as the distance along a vertical direction Z between the frontside 110 and the backside 120. In the lateral directions, the semiconductor body 10 may be terminated by the edge 1-4 (cf. FIG. 4). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the front side 110 and the backside 120 along the vertical direction Z in the active region 1-2, e.g., measured at a center of the active region 1-2.

A total lateral extension TLE of the transition section 1-23 amounts to at least 30% of the semiconductor body thickness d. TLE may also be greater than 30% of the thickness d, e.g., greater than 0.5*d, or even greater than 0.7*d. The thickness d of the semiconductor body 10 depends on the desired blocking voltage capability of the RC IGBT 1. The thickness d can for example be within the range of 40 μm to 800 μm. Further, the total lateral extension TLE of the transition section 1-23 may be substantially constant along the vertical extension of the transition section 1-23 along the vertical direction Z from the frontside 110 to the backside 120.

In an embodiment, a total lateral extension TLE1 of the IGBT section 1-21 amounts to at least 50% of the semiconductor body thickness d. TLE1 may also be greater than 50% of the thickness d, e.g., greater than 2*d, or even greater than 2.5*d, or even greater than 4*d.

In an embodiment, a total lateral extension TLE2 of the diode section 1-22 amounts to at least 20% of the semiconductor body thickness d. TLE2 may also be greater than 30% of the thickness d, e.g., greater than 0.5*d, or even greater than d.

A first load terminal 11 is at the semiconductor body frontside 110 and a second load terminal 12 is at the semiconductor body backside 120. The IGBT section 1-21 is configured for conduction of a forward load current between the first load terminal 11 and the second load terminal 12, e.g., if the electrical potential at the second load terminal 12 is greater than the electrical potential at the first load terminal 11. The diode section 1-22 is configured for conduction of a reverse load current between the first load terminal 11 and the second load terminal 12, e.g., if the electrical potential at the second load terminal 12 is lower than the electrical potential at the first load terminal 11.

Hence, in an embodiment, the diode section 1-22, which conducts the reverse load current, is spatially separated from the IGBT section 1-21, which conducts the forward load current. Furthermore, in an embodiment, the diode section 1-22 is independent from a control signal (e.g., the control signal provided to control electrodes 141 mentioned below). This means, that the diode section 1-22 may be configured such that it conducts the reverse load current as soon as the electrical potential (of the typical polarity) at the second load terminal 12 is lower (at least by the diode section internal threshold voltage) than the electrical potential at the first load terminal 11, irrespective of the control signal provided to the IGBT section 1-21.

The RC IGBT 1 further comprises a control terminal 13 for controlling the forward load current. The control terminal 13 may also be arranged at the frontside 110.

In accordance with the terminology typically associated with RC IGBTs, the control terminal 13 can be a gate terminal, the first load terminal 11 can be an emitter (source) terminal and the second load terminal 12 can be a collector (drain) terminal.

For example, the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. For example, as exemplary illustrated in FIGS. 2 and 3, said local contacts can be established by means of contact plugs 111 penetrating an insulation structure 13 so as to contact mesa portions 17.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 laterally overlaps with the edge termination region 1-3.

For example, the lateral boundary of the active region 1-2 is defined by the lateral boundary of the outermost power cell(s) of the diode section(s) 1-23 and or IGBT section(s) 1-21. Hence, the lateral boundary of the active region 1-2 may be defined at the frontside 110. This lateral boundary can be defined by an outermost source region(s) 101 (cf. explanation in more detail below). For example, all functional elements to enable conduction of the forward load current and the reverse load current are present in a vertical projection of the active region 1-2 of the RC IGBT 1, e.g., including at least the first load terminal 11 (e.g., a frontside metal contact thereof, e.g., one or more of the contact plugs 111), source region(s) 101, a body region 102, a drift region 100, a IGBT emitter region 103, a diode cathode region 104 and the second load terminal 12 (e.g., a backside metal thereof), as will be explained in more detail below.

In an embodiment, the edge termination region 1-3 and the active region 1-2 may be substantially symmetrically arranged to each other, e.g., with respect to a central vertical axis of the RC IGBT 1.

Furthermore, the lateral transition between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be observed at the backside 120, wherein the second load terminal 12 at the backside 120 is, e.g., laterally unstructured but homogeneously formed.

Now also referring to FIGS. 5 and 6, a plurality of trenches 14, 15, 16 is arranged in each of the IGBT section 1-21, the diode section 1-22 and the transition section 1-23, each trench 14, 15, 16 extending from the frontside 110 along the vertical direction Z into the semiconductor body 10 and comprising a respective trench electrode 141, 151, 161 isolated from the semiconductor body 10 by a respective trench insulator 142, 152, 162, wherein two adjacent trenches define a respective mesa portion 17 in the semiconductor body 10.

Each trench 14, 15, 16 may have a stripe configuration, e.g., as best illustrated in one of the horizontal projections, e.g. in FIG. 9 (B), meaning that the respective trench length (e.g., along the second lateral direction Y) is much greater than the respective trench width (e.g., along the first lateral direction X).

As will be explained further below, different type of trenches may be provided in the sections 1-21, 1-22 and 1-23. A first type of trench can be the control trench 14, whose trench electrode 141 is electrically connected to the control terminal 13 and is hence referred to as control electrode 141. A second type of trench can be the source trench 16, whose trench electrode 161 is electrically connected to the first load terminal 11 and is hence referred to as source electrode 161. A third type of trench can be another trench 15, whose trench electrode 151 is neither electrically connected to the first load terminal 11 nor to the control terminal 13. E.g., in one embodiment, trench 15 is a floating trench and trench electrode 151 is connected to no defined electrical potential, but electrically floating. E.g., in another embodiment, trench 15 is a dummy trench and trench electrode 151 is electrically connected to the control terminal 13 but does not directly control conduction of the forward load current as no electrically connected source region 101 (connected to the first load terminal) is arranged adjacent to trench 15. In yet another embodiment, the trench electrode 151 is connected to an electrical potential different from the electrical potential of the control terminal 13 and different from the electrical potential of the first load terminal 11.

Each trench type can be of equal dimensions in terms of width (along the first lateral direction X) and depth (along the vertical direction Z, e.g., distance between frontside 110 down to trench bottom) and/or length (along the second lateral direction Y).

The IGBT section 1-21 may comprise a plurality of IGBT cells, each IGBT cell having a certain trench pattern, i.e., a lateral sequence of trenches of specific types, e.g. one or more control trenches 14, zero or more source trenches 16 and zero or more other trenches 15. Analogously, the diode section 1-22 may comprise a plurality of diode cells, each diode cell having a certain trench pattern, i.e., a lateral sequence of trenches of specific types, e.g. one or more source trenches 16, zero or more other trenches 15 and zero or more control trenches 14.

As indicated above, the trenches 14, 15, 16 are arranged with each of the diode section 1-22, the IGBT section 1-21 and the transition section 1-23. In one embodiment, the trenches 14, 15, 16 in each of the IGBT section 1-21, the diode section 1-22 and the transition section 1-23 are laterally arranged next to one another in accordance with the same lateral trench pitch; i.e., the lateral trench pitch (that is, the distance between two adjacent trenches) does not alter between the sections 1-21, 1-22 and 1-23. The lateral trench pitch may define a lateral distance between two adjacent trenches of no more than 1/30 of the semiconductor body thickness d. In other words, the lateral widths of the mesa portions 17 in each of the diode section 1-22, the IGBT section 1-21 and the transition section 1-23 may be identical to each other.

Also, the trenches 14, 15, 16 may each exhibit the same trench depth (total vertical extension). For example, the lateral trench pitch may define a lateral distance between two adjacent trenches of no more than 50% or no more than 30% of the trench depth.

In an embodiment, the lateral trench pitch may define a lateral distance between two adjacent trenches of no more than 10 µm, or no more than 5 µm, or no more than 1 µm. For example, adjacent trenches are hence laterally displaced from each other by no more than 1 µm.

Hence, the width of each mesa portion 17 is within the range as defined by the lateral trench pitch.

Now additionally referring to FIG. 6, in the IGBT section 1-21, the average density of trench electrodes 141 electrically connected to the control terminal 13, i.e., the average density of control electrodes 141, is at least twice as great as the average density of control electrodes 141 (connected to the control terminal 13) in the transition section 1-23. The difference in control electrode density may be even greater than a factor of two, e.g., greater than a factor of three or four. It is even possible that no trench electrodes 141 are provided in the transition section 1-23, but only source trenches 16 and/or other trenches 15 in the embodiment of floating trenches with floating trench electrodes 151.

As explained above, the lateral trench pitch may be identical for all sections 1-21, 1-22 and 1-23. That means, that the average density of trench electrodes can be also be same for all sections 1-21, 1-22 and 1-23. However, as indicated above, the trench pattern, e.g., the arrangement of the different types of trenches may vary between the sections 1-21, 1-22 and 1-23. One variation is that the density of control electrodes 141 in the IGBT section 1-21 is at least twice as high as the density of control electrodes 141 in the transition section 1-23 (which may even amount to zero).

As used herein, the term "density" refers to the number of control electrodes 141 (or dummy electrodes 151 also connected to the control terminal 13) divided by the total number of trench electrodes present in the respective section 1-21, 1-22 or, respectively, 1-23.

In an illustrative example, the total number of trench electrodes in the IGBT section 1-21 is 120, and 40 trench electrodes are control electrodes 141, yielding a control electrode density of 30%. E.g., the total number of trench electrodes in the transition section 1-23 is 30, and 3 trench electrodes are control electrodes 141, yielding a control electrode density of 10%.

Hence, in an embodiment, each of the trenches 15, 16 that extend into the transition section 1-23 is either electrically floating or electrically connected to a potential different from the electrical potential of the control terminal 13, accordingly yielding a control trench density of 0%. In another embodiment, each of at least 80% of the trenches 14, 15, 16 that extend into the transition section 1-23 is either electrically floating or electrically connected to a potential different from the electrical potential of the control terminal 13, and wherein at least one of the remaining 20% of the trenches 14 that extend into the transition section 1-23 is electrically connected to the control terminal 13 for forming at least one local IGBT cell in the transition section 1-23. This aspect will be described in greater detail further below.

Figure 2:
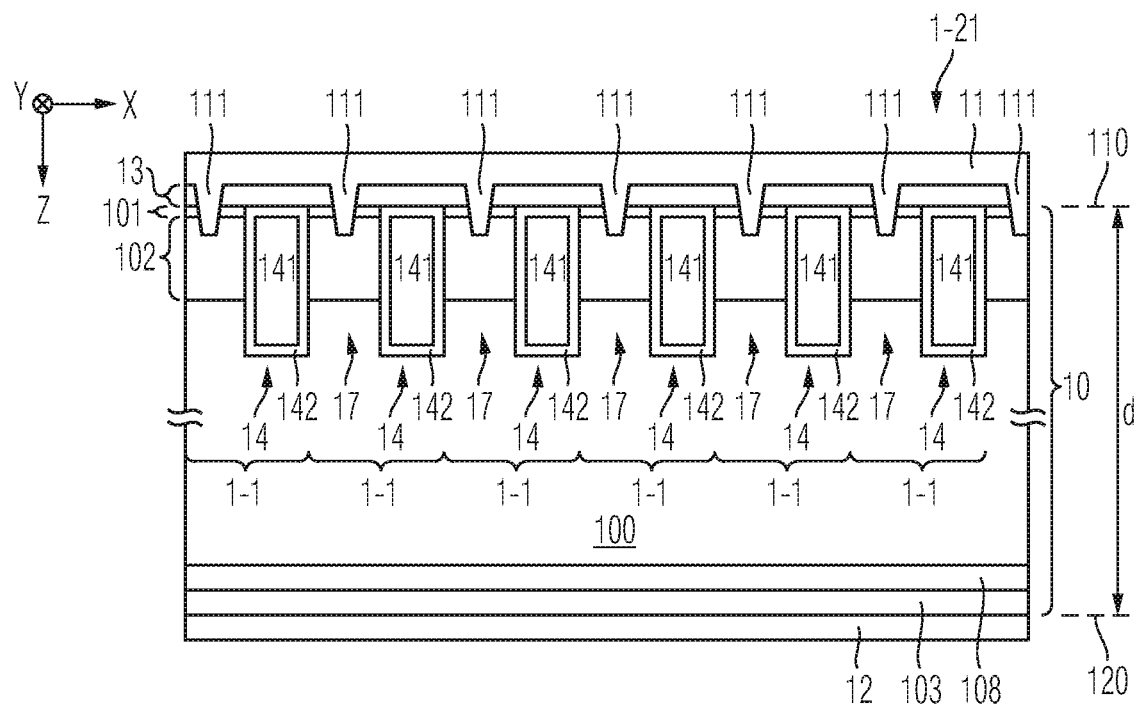
FIG. 2 schematically and exemplarily illustrates a section of a vertical cross-section of an IGBT section of an RC IGBT in accordance with some embodiments.
Figure 3:
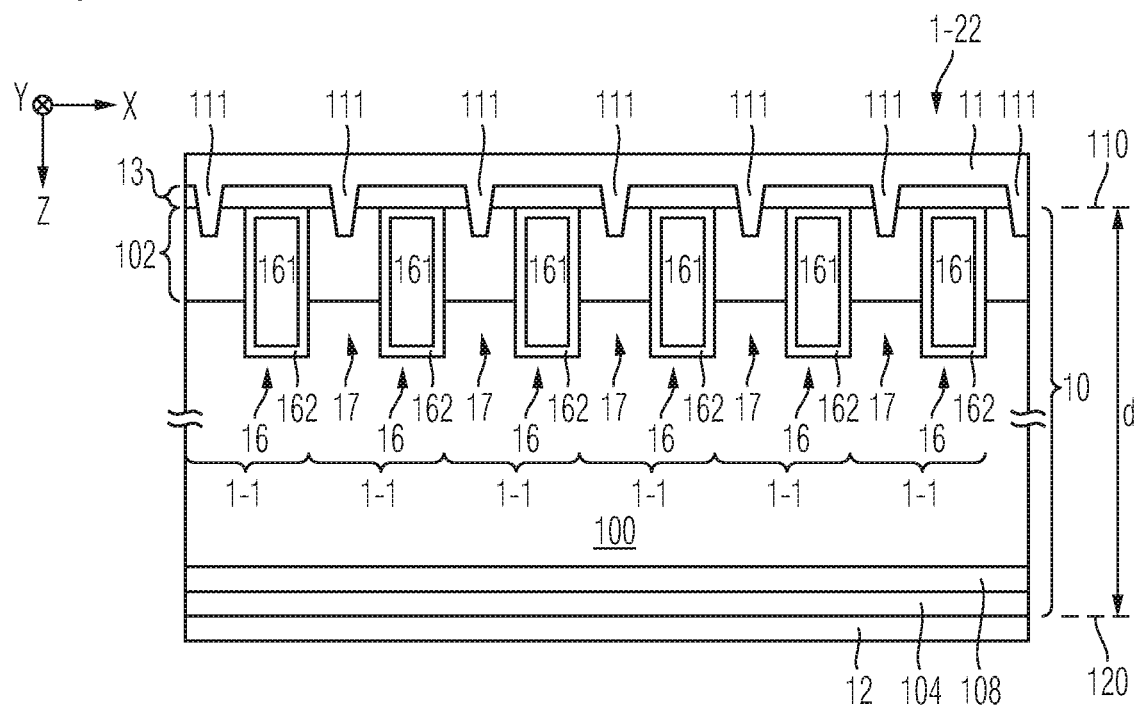
FIG. 3 schematically and exemplarily illustrates a section of a vertical cross-section of an diode section of an RC IGBT in accordance with some embodiments.

Reverting to FIGS. 2, 3 and 6, the RC IGBT 1 further comprises a drift region 100 of the first conductivity type formed in the semiconductor body 10 and extending into each of the IGBT section 1-21, the diode section 1-22 and the transition section 1-23.

A body region 102 of the second conductivity type is formed in the mesa portions 17 of the semiconductor body 10 and extends into each of the IGBT section 1-21, the diode section 1-22 and the transition section 1-23. At least portions of the body region 102 are electrically connected to the first load terminal 11. The body region 102 forms pn-junctions to subsections of the mesa portions 17 of the first conductivity type at least in the transition section 1-23. E.g., as will be described below and as illustrated in the drawings (e.g. FIG. 6), in an embodiment, not in each mesa portion 17, the respective portion of the body region 102 is electrically connected to the first load terminal 11.

Source region 101 of the first conductivity type are also arranged at the frontside 110 and electrically connected to the first load terminal 11. The source regions 101 are, e.g., only locally provided in the IGBT section 1-21 and do for example not extend into the diode section 1-22. However, in accordance with some embodiments, the some source regions 101 may also be locally provided in the transition section 1-23. In other embodiments, source regions are neither present in the diode section 1-22 nor in the transition section 1-23.

The body region 102 may be arranged in electrical contact with the first load terminal 11, e.g., by means of the contact plugs 111. In each IGBT cell of the IGBT section 1-21, there can furthermore be provided at least one source region 101 of the first conductivity type arranged in electrical contact with the first load terminal 11, e.g., also by means of the contact plugs 111. A major part of the semiconductor body 10 is formed as a drift region 100 of the first conductivity type, which may interface with the body region 102 and form a pn-junction therewith. The body region 102 isolates the source regions 101 from the drift region 100.

Upon receipt of a corresponding control signal, e.g., provided by a non-illustrated gate driver unit, each control electrode 141 can induce an inversion channel in a section of the body region 102 adjacent to the respective control electrode 141. Thus, each of the number of IGBT cells may be configured for conducting at least a portion of the forward load current between the first load terminal 11 and the second load terminal.

The above described basic configuration of the IGBT cells in the IGBT section 1-21 of the RC IGBT 1 is as such known to the skilled person, and the present specification employs the term "IGBT cell" within the scope of the technical meaning the skilled person typically associates therewith.

In an embodiment, the drift region 100 extends along the vertical direction Z, until it interfaces with a field stop layer 108, wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until interfacing with either an IGBT emitter region 103 of the IGBT section 1-21, a diode cathode region 104 of the diode section 1-22 or a doped region 109 of the transition section 1-23 (cf. FIG. 14)

The diode cathode region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

Each of the IGBT emitter region 103 of the IGBT section 1-21, the diode cathode region 104 of the diode section 1-22 and the doped region 109 of the transition section 1-23 can be arranged in electrical contact with the second load terminal 12.

Further optional aspects of the IGBT emitter region 103 of the IGBT section 1-21, the diode cathode region 104 of the diode section 1-22 and the doped region 109 of the transition section 1-23 will be described further below.

Overall, the IGBT emitter region 103 may act as an emitter of the second conductivity type. Furthermore, though the device is implemented as an RC IGBT 1, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode cathode region 104 is exclusively formed in the diode section 1-22, in accordance with some embodiments.

In an embodiment, the dopant concentration of the drift region 100 may be in the range of $10^{12}$ cm$^{-3}$ to $10^{14}$ cm$^{-3}$.

In an embodiment, the dopant concentration of each source region 101 may be in the range of $10^{19}$ cm$^{-3}$ to $10^{21}$ cm$^{-3}$.

In an embodiment, the dopant concentration of each body region 102 may be in the range of $10^{16}$ cm$^{-3}$ to $10^{18}$ cm$^{-3}$.

In an embodiment, the dopant concentration of the field stop layer 108 may be in the range of $10^{14}$ cm$^{-3}$ to $3*10^{16}$ cm$^{-3}$.

In an embodiment, the dopant concentration of the IGBT emitter region 103 may be in the range of $10^{16}$ cm$^{-3}$ to $10^{18}$ cm$^{-3}$. However, in an embodiment, the dopant concentration may vary along the lateral extension of the IGBT emitter region 103.

In an embodiment, the dopant concentration of the diode cathode region 104 may be in the range of $10^{19}$ cm$^{-3}$ to $10^{21}$ cm$^{-3}$. However, in an embodiment, the dopant concentration may vary (and even change is polarity) along the lateral extension of the diode cathode region 104.

It shall be noted that the trench patterns illustrated in FIGS. 2-3 are only exemplary; other trench patterns will be described with respect to the FIGS. 6-21.

In an embodiment, the diode section 1-22 is not equipped with source regions 101; e.g., in the diode section 1-22, there is no doped semiconductor region of the first conductivity type electrically connected to the first load terminal. Rather, for forming the diode configuration in the diode section 1-22 for conduction of the reverse load current, only the body region 102 is electrically connected to the first load terminal 11, wherein the body region 102 forms a pn-junction with, e.g., the drift region 100 (or, if present, the further barrier region 105), and along the vertical direction Z towards the second load terminal 12, there is a semiconductor path of only the first conductivity type, not interrupted by any further regions of the second conductivity type.

As explained above, in contrast to the diode section 1-22, the IGBT section 1-21 comprises at least one IGBT cell with a section of the source region 101 connected to the first load terminal 11 and arranged adjacent to one of the control trenches 14 and isolated from the drift region 100 (or, if present, the yet further barrier region 106) by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward load current are present in a vertical projection of the IGBT section 1-21 of the RC IGBT 1, e.g., including at least the first load terminal 11 (e.g., a frontside metal contact thereof, e.g., one or more of the contact plugs 111), the source region(s) 101, the body region 102, the drift region 100, the IGBT emitter region 103, and the second load terminal 12 (e.g., a backside metal thereof). Furthermore, said functional elements may extend along the total lateral extension TLE1 of the IGBT section 1-21

Now referring in more detail to FIG. 6, at least in the transition section 1-23, a barrier region 107 of the first conductivity having a peak dopant concentration at least 100 times greater than an average dopant concentration of the drift region 100 is arranged at least in portions of the mesa subportions that interface with body region 102. The average dopant dose of the mesa subportions in the transition section 1-23 is at least a factor of 1.2 higher than the average dopant dose of mesa subportions in the diode section 1-22.

Here, it shall be noted that the dopant doses mentioned in the preceding paragraph are both related to the dopant concentration of dopants of the first conductivity type; e.g., as will be explained in more detail with respect to FIG. 21, the body region 102 can in the diode section 1-22 extend even below the trench bottoms, such that some or all of the mesa portions 17 in the diode section 1-22 are of the second conductivity type (yielding there an average dopant dose related to the dopant concentration of dopants of the first conductivity type substantially amounting to zero).

The peak dopant concentration of the barrier region 107 may amount to at least $1*10^{15}$ cm$^{-3}$, to at least $2*10^{16}$ cm$^{-3}$ or to even more than $5*10^{17}$ cm$^{-3}$.

As indicated above, the average dopant concentration of the drift region 100 may be within the range of $1*10^{12}$ cm$^{-3}$ to $1*10^{14}$ cm$^{-3}$. For example, the average dopant concentration of the drift region 100 is determined in a section of the drift region 100 below the trench bottoms.

The average dopant dose of the mesa subportions in the transition section 1-23 may amount to at least $1*10^{12}$ cm$^{-2}$, to at least $5*10^{12}$ cm$^{-2}$ or to even more than $2*10^{13}$ cm$^{-2}$. As explained, this average dopant dose may be achieved by means of the barrier region 107 extending into these mesa subportions in the transition section 1-23.

The average dopant dose of the mesa subportions in the diode section 1-22 may be within the range of $5*10^{11}$ cm$^{-2}$ to $2*10^{13}$ cm$^{-2}$ e.g., amount to $4*10^{13}$ cm$^{-2}$. As will be explained, this average dopant dose may be achieved by means of the further barrier region 105 and/or the drift region extending into these mesa subportions in the diode section 1-22.

The average dopant dose of the mesa subportions in the IGBT section 1-21 may be within the range of $5*10^{11}$ cm$^{-2}$ to $2*10^{13}$ cm$^{-2}$ e.g., amount to $4*10^{13}$ cm$^{-2}$. As will be explained, this average dopant dose may be achieved by means of the yet further barrier region 106 and/or the drift region extending into these mesa subportions in the IGBT section 1-21.

Hence, the average dopant dose of the mesa subportions in the transition section 1-23 is at least a factor of 1.2 higher than the average dopant dose of mesa subportions in the diode section 1-22. The average dopant dose of the mesa subportions in the transition section 1-23 can be even higher by a factor of at least 1.5, or of a least two than the average dopant dose of mesa subportions in the diode section 1-22. At the same time, optionally, the average dopant dose of the mesa subportions in the IGBT section 1-21 can be least a factor of 1.2 lower than the average dopant dose of mesa subportions in the transition section 1-23. The average dopant dose of the mesa subportions in the IGBT section 1-21 can be even lower by a factor of at least 1.5, or of a least 2 than the average dopant dose of mesa subportions in the transition section 1-23.

Said mesa subportions in the mesa portions 17 of the sections 1-21, 1-22 and 1-23 may hence be formed by either the drift region 100 extending into the mesa portions 17 or, additionally or alternatively, by the barrier region 107 extending into the mesa portions 17 of the transition section 1-23, or, respectively, as will be explained in more detail below, the further barrier region 105 extending into the mesa portions 17 of the diode section 1-22, or, respectively, as will be explained in more detail below, the yet further barrier region 106 extending into the mesa portions 17 of the IGBT section 1-21.

Thus, in an embodiment, with respect to dopants of the first conductivity type, the average dopant dose of the mesa subportions forming a pn-junction with the body region 102 can be highest within the transition section 1-23, compared to the corresponding mesa subportions of the IGBT section 1-21 and the diode section 1-22. At the same time, the density of the control electrodes 141 present in the IGBT section 1-21 is greater than the density of the control electrodes 141 present in the transition section 1-23 (which may even be zero).

For example, each of the dopant doses referred to herein is defined by the dopant concentration integrated along the vertical direction Z (that points from the first load terminal 11 to the second load terminal 12).

Further, each of the average dopant doses referred to herein can be defined as the dopant dose averaged along a distance of at least 5 µm or a distance of at least 10 µm in at least one of the lateral directions X/Y perpendicular to the vertical direction Z. The respective average dopant dose can even be defined by the dopant dose averaged along the total lateral extension of the respective region, or, respectively, volume, in the lateral direction X/Y. For example, for comparison purposes, the average dopant dose of the mesa subportions in the transition section 1-23 is determined at the same vertical level and along the same lateral distance as the average dopant dose of mesa subportions in the diode section 1-22.

For example, the dopant dose of the mesa subportions in the transition section 1-23 is determined by integrating the dopant concentration in the respective mesa subportion from the pn-junction at the body region 102 down to the level of the trench bottoms. Accordingly, in an example, the dopant dose of the mesa subportions in the diode section 1-22 is determined by integrating the dopant concentration in the respective mesa subportion from the pn-junction at the body region 102 down to the level of the trench bottoms in the diode section 1-22. Furthermore, in that example, the average dopant dose of the mesa subportions in the transition section 1-23 is the average dopant dose along the total lateral extension TLE of the transition section 1-23 in the first lateral direction X, and the average dopant dose of mesa subportions in the diode section 1-22 is the average dopant dose along the total lateral extension TLE2 of the diode section 1-22 in the first lateral direction X.

Further, the term "average dopant dose" refers to electrically active dopants of the same conductivity type. Hence, a change in average dopant dose may also be achieved by keeping the dose of one dopant type constant in both portions and by applying a counter-doping and/or damage-doping. Also by such means, a difference between the (net) average dopant doses can be achieved.

Furthermore, it shall be understood that the integration path according to which the average dopant dose is determined does not extend beyond the boundaries of the relevant semiconductor portion.

In an embodiment, at least a part of the body region 102 in the IGBT section 1-21 is coupled to the drift region 100 without the barrier region 107 and/or at least a part of the body region 102 in the diode section 1-22 is coupled to the drift region 100 without the barrier region 107. For example, in one embodiment, the body region 102 in both the IGBT section 1-21 and the diode section 1-22 couples directly to the comparatively weakly doped drift region 100, as illustrated in FIG. 6. In this embodiment, there is no barrier region of the first conductivity type or the like implemented in the mesa portions 17 of the IGBT section 1-21 and the diode section 1-22.

The total lateral extension of the barrier region 107 in the transition section 1-23 may be identical to the total lateral extension TLE of the transition section 1-23, wherein, of course, the barrier region 107 is repeatly intersected by the trenches 15/16 of the transition section 1-23.

For example, the trenches in the diode section 1-22 and the transition section 1-23 are either source trenches 16 or floating trenches 15. Furthermore, each mesa portion in the diode section 1-22 and the transition section 1-23 may be electrically connected to the first load terminal 11, e.g., by means of the contact plugs 111.

By contrast, the trench types in the IGBT section 1-21 may vary; in accordance with the illustrated embodiment, a subsequently repeating trench-mesa-pattern corresponding to "kGkSoSoDoSoS" may be employed for forming IGBT cells, one of which being illustrated in FIG. 6, wherein "k" denotes a mesa portion 17 connected to the first load terminal 11, "o" denotes a mesa portion 17 not connected to the first load terminal 11 (i.e., meaning the transition between the first load terminal 11 and the mesa portion 17 along the vertical direction Z is not conductive), "G" denotes a gate trench 14, "S" denotes a source trench 16 and "D" denotes a dummy trench 15 (which is identical to a gate trench arranged between non-contacted mesa portions 17). Of course, different trench-mesa-patterns may be used in other embodiments.

In an embodiment, the average dopant dose of the barrier region 107 amounts at least to 20% and to no more than 500% of the average dopant dose of the body region 102 in the transition section 1-23. Again, the respective average dopant doses may be the dopant doses averaged along the total lateral extension TLE of the transition section 1-23. E.g., in accordance with these exemplary provisions, the average dopant dose of the barrier region 107 may be within the range of $1*10^{12}$ cm$^{-2}$ to $5*10^{12}$ cm$^{-2}$ e.g., amount to $5*10^{13}$ cm$^{-2}$. E.g., the average dopant dose of the body region 102 in the transition section 1-23 may be within the range of $5*10^{12}$ cm$^{-2}$ to $2*10^{13}$ cm$^{-2}$ e.g., amount to $5*10^{13}$ cm$^{-2}$, wherein, for example, the dopant dose is determined adjacent to the trench sidewall, and does not include highly doped contact regions close to the contact surface.

Here, it shall be pointed out the body region 102 may be equally configured in each of the diode section 1-22, the transition section 1-23 and the IGBT section 1-21. For example, the body region 102 is not laterally structured with respect to the diode section 1-22, the transition section 1-23 and the IGBT section 1-21. Hence, the above indicated average dopant dose of the body region 102 in the transition section 1-23 may also be present in the diode section 1-22 and in the IGBT section 1-21.

In another embodiment, the configuration of the body region 102 is identical in both the IGBT section 1-21 and the transition section 1-23, but is different in the diode section 1-22, as already indicated above with respect to FIG. 21. For example, there, the body region 102 is more heavily doped and/or extends deeper into the semiconductor body 10 along the vertical direction Z, e.g., even deeper than the trench bottoms in the diode section 1-22.

In an embodiment, at least one of the average dopant dose of the mesa subportions in the IGBT section 1-21, the average dopant dose of the mesa subportions in the diode section 1-22 and the average dopant dose of the mesa subportions in the transition section 1-23 (which all interface with body region 102) is achieved at least by means of a lateral structure of a barrier layer comprising the barrier region 107. E.g., referring to FIG. 12, a further barrier region 105 may be arranged in the diode section 1-22, and a yet further barrier region 106 may be arranged in the IGBT section 1-21. The barrier regions 105, 106, 107 may be produced within the same processing step(s), e.g., by using a correspondingly structured mask during an implantation processing step; hence, the lateral structure of the barrier layer, or, respectively, the lateral structure of a mask used during formation of the barrier layer may ensure that, e.g., with respect to dopants of the first conductivity type, the average dopant dose of the mesa subportions forming a pn-junction with the body region 102 can be highest within the transition section 1-23, compared to the corresponding mesa subportions of the IGBT section 1-21 and the diode section 1-22. The mask used during the implantation step would then have different ratios of open to masked areas so that a larger area of the mesa subportions are implanted with dopants of the first conductivity type in the transition section 1-23 than in the diode section 1-22 or in the IGBT section 1-21. The average dopant dose of the mesa subportions are then determined by taking the average dopant doses of mesa subportions comprising the barrier region 107 and of mesa subportions not comprising the barrier region 107. At the same time, as mentioned above, the density of the control electrodes 141 present in the IGBT section 1-21 is greater than the density of the control electrodes 141 present in the transition section 1-23 (which may even be zero). Furthermore, it shall be understood that the average dopant doses of the mesa subportions forming a pn-junction with the body region 102 of the IGBT section 1-21 and the diode section 1-22 may differ from each other, wherein, again, this difference may be achieved by using a correspondingly structured mask. Still referring to FIG. 12, it shall be understood that the further barrier regions 105, 106 are optionally provided and may be omitted in other embodiments (cf. FIG. 6); in the latter case, where the barrier region 107 (or a more weakly doped barrier region) does not extend into the diode section 1-22 nor into the IGBT section 1-21, the mask used for forming the barrier layer would hence completely block the diode section 1-22 and the IGBT-section 1-21 from being subjected to the implantation.

In an embodiment, the RC IGBT 1 hence comprises in the diode section 1-22, a further barrier region 105 of the first conductivity having a peak dopant concentration at least 10 times or even 100 times as great as an average dopant concentration of the drift region 100 and laterally extending along at least 10% of the total lateral extension TLE2 of the diode section 1-22, wherein at least a part of the body region 102 in the diode section 1-22 is coupled to the drift region 100 at least by means of the further barrier region 105.

Additionally or alternatively, the RC IGBT 1 comprises in the IGBT section 1-21, a yet further barrier region 106 of the first conductivity having an average dopant concentration at least 10 times or even 100 times as great as an average dopant concentration of the drift region 100 and laterally extending along at least 10% of the total lateral extension TLE1 of the IGBT section 1-21, wherein at least a part of the body region 102 in the IGBT section 1-21 is coupled to the drift region 100 at least by means of the yet further barrier region 106, in accordance with an embodiment.

Exemplary aspects of the barrier layer comprising the barrier region 107 and, the optional further barrier region 105 and the yet further barrier region 106 are described below.

For example, with respect to another optional implementation of the barrier layer, it is referred to FIG. 7. Compared to the embodiment of FIG. 6, the configuration of the transition section 1-23 and the configuration of the IGBT section 1-21 have not been altered. In accordance with variants (A) and (B), the further barrier region 105 is provided in the diode section 1-22, wherein forming this further barrier region 105 can be implemented by means of using a correspondingly structured mask during an implantation that is also employed for forming the barrier region 107 in the transition section 1-23. Yet, even with presence of the further barrier region 105, it is ensured that the average dopant dose of the mesa subportions in the transition section 1-23 (that form the pn-junction with the body region 102 in the transition section 1-23) is at least a factor of 1.2 higher than the average dopant dose of the mesa subportions in the diode section 1-22 (that form the pn-junction with the body region 102 in the diode section 1-22).

The average dopant dose of the further barrier region 105 may be within the range of $5*10^{11}$ cm$^{-2}$ to $2*10^{13}$ cm$^{-2}$ e.g., amount to $4*10^{13}$ cm$^{-2}$. Also this average dopant dose may be the dopant dose averaged along the total lateral extension TLE2 of the diode section 1-22.

In accordance with variant (A) of FIG. 7, the further barrier region 105 is implemented in every mesa portion 17 of the diode section 1-22. Alternatively, in accordance with variant (B) of FIG. 7, the further barrier region 105 is implemented only in a subset of the mesa portions 17 of the diode section 1-22, e.g., only in 20% to 80% of the mesa portions 17 of the diode section 1-22. Then, with respect to a respective single mesa portion 17 in the diode section 1-22 and the transition section 1-23, the dopant doses may even be equal to one another; however averaged along the total lateral extension TLE2 of the diode section 1-22, the average dopant dose of the further barrier region 105 in the diode section 1-22 is lower that than the correspondingly averaged dopant dose of the barrier region in the transition section 1-23, thereby meeting the provision that the average dopant dose of the mesa subportions in the transition section 1-23 (that form the pn-junction with the body region 102 in the transition section 1-23) is at least a factor of 1.2 higher than the average dopant dose of the mesa subportions in the diode section 1-22 (that form the pn-junction with the body region 102 in the diode section 1-22).

Now referring to the embodiment illustrated in FIG. 8, where, compared to the embodiment of FIG. 6, the configuration of the diode section 1-22 and the configuration of the IGBT section 1-21 have not been altered, the transition section 1-23 comprises a number of (in the example one) local IGBT cell. Yet, the provision that, in the IGBT section 1-21, the average density of trench electrodes 141 electrically connected to the control terminal 13 is at least twice as great as the average density of trench electrodes 141 connected to the control terminal 13 in the transition section 1-23, is fulfilled. In the example, one gate trench 14 is provided in the transition section 1-23 together with associated source regions 101 in the adjacent mesa portions 17. In an embodiment, as it is also illustrated in FIG. 11, the barrier region 107 in the transition section 1-23 can be laterally structured, e.g., such that no lateral overlap between the barrier region 107 and the at least one local IGBT cell in the transition section 1-23 is formed. In another embodiment, the barrier region 107 is not structured in the transition section 1-23, but extends continuously, e.g., contiguously without any alteration, within the transition section 1-23 (as exemplarily illustrated in FIG. 9). Both embodiments can be implemented with the variant shown in FIG. 8.

Now referring to the embodiment illustrated in FIG. 9, where, compared to the embodiment of FIG. 8, the configuration of the diode section 1-22 and the configuration of the transition section 1-23 have not been altered, the IGBT section 1-21 is equipped with the yet further barrier region 106. Section (A) illustrates the vertical cross-section, and section (B) the corresponding horizontal projection of the same section of this embodiment of the RC IGBT 1. In accordance with this embodiment, the yet further barrier region 106 is provided in the IGBT section 1-21, wherein forming this yet further barrier region 106 can be implemented by means of using a correspondingly structured mask during an implantation that is also employed for forming the barrier region 107 in the transition section 1-23.

Yet, even with presence of the yet further barrier region 106, it may be ensured that the average dopant dose of the mesa subportions in the transition section 1-23 (that form the pn-junction with the body region 102 in the transition section 1-23) is at least a factor of 1.2 higher than the average dopant dose of the mesa subportions in the IGBT section 1-21 (that form the pn-junction with the body region 102 in the IGBT section 1-21). But, referring to FIGS. 19 and 20, which both illustrate variations of yet further barrier region 106 compared to the variant in FIG. 9-11, it shall understood that the latter feature need not necessarily provided. E.g., the average dopant dose of the mesa subportions in the transition section 1-23 (that form the pn-junction with the body region 102 in the transition section 1-23) can alternatively be substantially identical as the average dopant dose of the mesa subportions in the IGBT section 1-21 (that form the pn-junction with the body region 102 in the IGBT section 1-21). In other words, the average dopant dose of the yet further barrier region 106 can be as great as the average dopant dose of the barrier region 107; e.g., provided that the transition section 1-23 comprises no local IGBT cells (cf. FIG. 19, i.e., no control electrodes 141 at all) or, respectively, allowing local IGBT cells in the transition section 1-23 (cf. FIG. 20) as long it is ensured that the average density of trench electrodes 141 electrically connected to the control terminal 13 is at least twice as great as the average density of trench electrodes 141 connected to the control terminal 13 in the transition section 1-23.

The average dopant dose of the yet further barrier region 106 may be within the range of $5*10^{11}$ cm$^{-2}$ to $2*10^{13}$ cm$^{-2}$ e.g., amount to $4*10^{13}$ cm$^{-2}$. Also, this average dopant dose may be the dopant dose averaged along the total lateral extension TLE1 of the IGBT section 1-21.

In accordance with the variant of FIG. 9, the yet further barrier region 106 is implemented only in a subset of the mesa portions 17 of the IGBT section 1-21, e.g., only in 30% of the mesa portions 17 of the IGBT section 1-21. Then, the with respect to a respective single mesa portion 17 in the IGBT section 1-21 and the transition section 1-23, the dopant doses may even be equal to another; however averaged along the total lateral extension TLE1 of the IGBT section 1-21, the average dopant dose of the yet further barrier region 106 in the IGBT section 1-21 is lower that than the correspondingly averaged dopant dose of the barrier region 107 in the transition section 1-23, thereby meeting the optional provision that the average dopant dose of the mesa subportions in the transition section 1-23 (that form the pn-junction with the body region 102 in the transition section 1-23) is at least a factor of 1.2 higher than the average dopant dose of the mesa subportions in the IGBT section 1-21 (that form the pn-junction with the body region 102 in the diode section 1-22).

For example, if provided, the yet further barrier region 106 may laterally overlap with the source regions 101 in the IGBT section 1-21, as illustrated in FIG. 9. Alternatively, such the structure of the yet further barrier region 106 may be such that the overlap is avoided, as illustrated in FIG. 10 (which, beyond this difference, illustrates the same embodiment as FIG. 9). Furthermore, the lateral structure achieved by means of the recesses 1061 may again be formed by using a correspondingly structured mask during formation of the barrier layer.

Now referring to the embodiment illustrated in FIG. 11, where, compared to the embodiment of FIG. 10, the configuration of the diode section 1-22 and the configuration of the IGBT section 1-21 have not been altered, the barrier region 107 in the transition section 1-23 may be laterally structured, as has already been indicated above, namely for example in a manner, such that no lateral overlap between the barrier region 107 and the at least one local IGBT cell in the transition section 1-23 is formed. This may be achieved by one or more corresponding recesses 1071 in the barrier region 107 that laterally overlap with the source regions 101 of the local IGBT cells in the transition section 1-23. Yet, even in this embodiment, where the average dopant dose of the barrier region 107 is reduced due to the at least one recess 1071, it may be ensured that that the average dopant dose of the mesa subportions in the transition section 1-23 (that form the pn-junction with the body region 102 in the transition section 1-23) is at least a factor of 1.2 higher than the average dopant dose of the mesa subportions in the IGBT section 1-21 (that form the pn-junction with the body region 102 in the IGBT section 1-21). E.g., even if the local dopant doses of the barrier regions 107 and 106 are identical in both the transition section 1-23 and the IGBT section 1-21, such difference in the average dopant doses (averaged along the total lateral extension TLE1 of the IGBT section 1-21 or, respectively, the total lateral extension TLE of the transition section 1-23) is achieved by, e.g., an increased number and/or area of the recesses 1061 in the yet further barrier region 106 as compared to the recess(es) 1071 of the barrier region 107 in the transition section 1-23.

As indicated above, the barrier region 107 and, if present, the further barrier region 105 and/or the yet further barrier region 106, may form a barrier layer of the RC IGBT 1. The barrier layer may be a contiguous barrier layer, optionally provided with recesses 1071, 1061, e.g., such that vertical projections of the source regions 101 in the IGBT section 1-21 and (if present) in the transition section 1-23 are devoid of the barrier regions 106, 107.

Now referring to the embodiment illustrated in FIG. 12, compared to the embodiment of FIG. 6, the configuration of the diode section 1-22, the configuration of the IGBT section 1-21 and the configuration of the transition section 1-23 have not been altered besides the addition of the further barrier region 105 in the diode section 1-22 and the further barrier region 106 in the IGBT section 1-21. In this example, the further barrier regions 105 and 106 are laterally unstructured, as the barrier region 107 in the transition section 1-23, but the average dopant doses of the barrier regions 105 and 106 are both equally lower than the average dopant dose of the barrier region 107, e.g., by a factor of two, e.g., such that the sum of the average dopant doses of the barrier regions 105 and 106 is about as great as the average dopant dose of the barrier region 107. For example, for achieving such configuration, the same first implantation can be applied in each of the sections 1-21, 1-22 and 1-23, and an additional second implantation is applied in the transition section 1-23 (but not in sections 1-22 and 1-21). Or, for achieving such configuration, the same first implantation can be applied in both sections 1-21 and 1-23, and the additional second implantation is applied in both sections 1-22 and 1-23 (but not in section 1-21). Again, even though barrier regions are provided not only in the transition section 1-23, but in both the diode section 1-22 and the IGBT section 1-21, it may be ensured that both (a) the average dopant dose of the mesa subportions in the transition section 1-23 (that form the pn-junction with the body region 102 in the transition section 1-23) is at least a factor of 1.2 higher than the average dopant dose of the mesa subportions in the diode section 1-22 (that form the pn-junction with the body region 102 in the diode section 1-22) and (b) the average dopant dose of the mesa subportions in the transition section 1-23 (that form the pn-junction with the body region 102 in the transition section 1-23) is at least a factor of 1.2 higher than the average dopant dose of the mesa subportions in the IGBT section 1-21 (that form the pn-junction with the body region 102 in the IGBT section 1-21).

With respect to FIGS. 13 to 20, exemplary aspects of the doped regions 103, 104 and 109 of the sections 1-21, 1-22 and 1-23 shall be explained based on corresponding sections of horizontal projections as shown in FIGS. 14, 16, and 18. The associated sections of the vertical cross-sections shown in FIGS. 13, 15 and 17, respectively, are identical to FIG. 6 for illustration purposes. However, the above described optional modifications/variants of the design of the sections 1-21, 1-22 and 1-23 at the frontside 110 may also be implemented in combination with the variants/modification at the backside 120 which will now be described.

In some implementations, as exemplarily illustrated in each of the variants of FIGS. 14, 16 and 18, the IGBT emitter region 103 is doped with dopants of the second conductivity type and does not comprise any portions of the first conductivity type. The doping can be homogeneously or, alternatively, as exemplarily illustrated in variants (A) and (B) of FIG. 18, the IGBT emitter region 103 is a laterally structured region with a number of higher doped IGBT emitter subregions 1031 of the second conductivity type electrically connected to the second load terminal 12 and coupled to the drift region 100, and with a number of lower doped IGBT emitter subregions 1032 of the second conductivity type electrically connected to the second load terminal 12 and coupled to the drift region 100. The difference in average dopant doses of the subregions 1031 and 1032 may amount to a factor of 10 or even 100. The difference in average dopant doses of the subregions 1031 and 1032 may allow for achieving a lower level of hole injection during reverse recovery.

Furthermore, in some implementations, as exemplarily illustrated in each of the variants of FIG. 14 (A), (B1), (B2), FIGS. 16 (Aa) and (B2a) and FIGS. 18 (A) and (B), the diode cathode region 104 can be entirely of the first conductivity type and electrically connected to the second load terminal 12 and coupled to the drift region 100. For example, the diode cathode region 104 in these implementations is not structured but homogeneously doped.

In other implementations, as exemplarily illustrated in each of the variants of FIG. 14 (C), FIGS. 16 (Ab) and (B2b), the diode cathode region 104 laterally interrupted by one or more subregions 1041 of the second conductivity type that are electrically connected to the second load terminal 12 and coupled to the drift region 100. The subregions 1041 of the second conductivity type can make up to 50% of the total lateral extension of the diode cathode region 104 (which is identical to TLB2 described above), as shown in FIG. 14 (C). In other implementations, as shown in FIGS. 16 (Ab) and (B2b), the subregions 1041 of the second conductivity type can make up to only significantly less than 50% total lateral extension of the diode cathode region 104 and are for example only be provided in proximity to the transition section 1-23. In terms of dopant dose, the subregions 1041 of the second conductivity can be identically configured as the IGBT emitter region 103. E.g., providing the subregions 1041 of the second conductivity as part of the diode cathode region 104 may allow for hole injection during reverse recovery to prevent a current snap-off.

Many variants are available for forming the doped region 109 of the transition section 1-23 at the backside 120. In some implementations, the configuration of the IGBT emitter region 103 may be simply extended without modification into the transition section 1-23. Hence, in an embodiment, the configuration of doped region 109 of the transition section 1-23 is identical to the configuration of the IGBT emitter region 103, shown in FIG. 14 (A), (B), FIG. 16 (Ab) and FIG. 17 (B). Hence, the doped region 109 can be of the second conductivity type as the IGBT emitter region 103, wherein either the IGBT emitter region 103 is a laterally structured region with said number of higher doped IGBT emitter subregions 1031 of the second conductivity type electrically connected to the second load terminal 12 and coupled to the drift region 100, and with said number of lower doped IGBT emitter subregions 1032 of the second conductivity type electrically connected to the second load terminal 12 and coupled to the drift region (100); and, accordingly, cf. FIG. 18 (B), the doped region 109 is also a laterally structured region with a number of higher doped subregions 1091 of the second conductivity type electrically connected to the second load terminal 12 and coupled to the drift region 100, and with a number of lower doped subregions 1092 of the second conductivity type electrically connected to the second load terminal 12 and coupled to the drift region 100. The difference in average dopant doses of the subregions 1091 and 1092 may correspond to those chosen for IGBT emitter region 103 and diode cathode region 104. The difference in average dopant doses of the subregions 1091 and 1092 may allow for achieving a strongly reduced electron injection in the diode on-state mode and a very low hole injection during reverse recovery.

In other implementations, as shown in FIGS. 14 (B1), (B2), and in FIG. 16 (B2a), (B2b), the doped region 109 is not exclusively of the second conductivity type, but a hybrid region with a number of first subregions 1091 of the first conductivity type electrically connected to the second load terminal 12 and coupled to the drift region 100, and a number of second subregions 1092 of the second conductivity type electrically connected to the second load terminal 12 and coupled to the drift region 100. The average dopant dose of each of the number of second subregions 1092 of the second conductivity type may be substantially identical to the average dopant dose of the IGBT emitter region 103, and the average dopant dose of each of the number of first subregions 1091 of the first conductivity type may be substantially identical to the average dopant dose of the diode cathode region 104. The design of the doped region 109 with regards to the distribution and dimension of the first and second subregions 1091, 1092 may be chosen in dependence of the forward current density, the reverse recovery current density, the semiconductor body thickness d and the dopant concentration of the field stop layer 108. For example, the higher the current densities the lower the dimension. The dimension can for example be less than 30% or less than 10% or even less than 5% of the semiconductor body thickness d.

For example, in case of the doped region 109 being a hybrid region formed, e.g., by means of a p-n-stripe structure as illustrated in FIGS. 14 (B1) and (B2), the diode performance is only marginally affected, but the reverse recovery behavior of the RC IGBT 1 is improved.

Now referring to FIG. 21, a yet further embodiment of the RC IGBT 1 shall be explained. This embodiment can exhibit all the features explained above with respect to FIGS. 1-20, except for the further barrier region 105 in the diode section 1-22. Rather, in accordance with the embodiment of FIG. 21, the body region 102 of the diode section 1-22 extends further along the vertical direction Z as compared to the body region 102 in the IGBT section 1-21 by a factor of at least 150% compared to the deepest level of the body region 102 in the IGBT section 1-21 along the vertical direction Z. For example, the barrier region 107 of the transition section 1-23 and the body region 102 of the diode section 1-22 have a common vertical extension range amounting to at least 20% of the total vertical extension range of the barrier region 107. As illustrated, the "deep" body region 102 of the diode section 1-22 may extend even beyond the trench bottoms. The "deep" body region 102 of the diode section 1-22 may be laterally unstructured and extend homogeneously within the total lateral extension TLE2 of the diode section 22.

In an embodiment, the "deep" body region 102 may improve controllability and/or performance of the RC IGBT 1 due to a beneficial distribution of the electrical potential in proximity to the frontside 110 at the diode section 1-22.

Present herein is also a method of forming an RC IGBT. The method comprises forming the following components: an active region with an IGBT section, a diode section and a transition section between the IGBT section and the diode section, wherein the IGBT section and the diode section adjoin the transition section from opposing lateral directions; an edge termination region surrounding the active region; a semiconductor body having a frontside and a backside, a thickness of the semiconductor body being defined as the distance along a vertical direction between the frontside and the backside, wherein a total lateral extension of the transition section amounts to at least 30% of the semiconductor body thickness; a plurality of trenches arranged in each of the IGBT section, the diode section and the transition section, each trench extending from the frontside along the vertical direction into the semiconductor body and comprising a trench electrode isolated from the semiconductor body by a trench insulator, wherein two adjacent trenches define a respective mesa portion in the semiconductor body; a first load terminal at the semiconductor body frontside and a second load terminal at the semiconductor body backside. The IGBT section is configured for conduction of a forward load current between the first load terminal and the second load terminal. The diode section is configured for conduction of a reverse load current between the first load terminal and the second load terminal. The method further comprises forming a control terminal for controlling the forward load current, wherein, in the IGBT section, the average density of trench electrodes electrically connected to the control terminal is at least twice as great as the average density of trench electrodes connected to the control terminal in the transition section. The method further comprises forming a drift region of a first conductivity type in the semiconductor body and extending into each of the IGBT section, the diode section and the transition section; and a body region of a second conductivity type formed in the mesa portions of the semiconductor body and extending into each of the IGBT section, the diode section and the transition section. At least portions of the body region are electrically connected to the first load terminal, wherein the body region forms pn-junctions to subsections of the mesa portions of the first conductivity type at least in the transition section. The method further comprises, forming, at least in the transition section, a barrier region of the first conductivity having a peak dopant concentration at least 100 times greater than an average dopant concentration of the drift region and arranged at least in portions of the mesa subportions. The average dopant dose of the mesa subportions in the transition section is at least a factor of 1.2 higher than the average dopant dose of mesa subportions in the diode section.

Exemplary embodiments of this method correspond to the embodiment of the RC IGBT 1 described above. In one embodiment, the method comprises using a laterally structured mask for forming a barrier layer including at least the barrier region 107 and, optionally, at least one of the further barrier region 105 and the yet further barrier region 106, as explained above.

In the above, embodiments pertaining to RC IGBTs and corresponding processing methods were explained.

For example, these RC IGBTs are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1−x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RC IGBT, comprising:
    an active region with an IGBT section, a diode section and a transition section between the IGBT section and the diode section, the IGBT section and the diode section adjoining the transition section from opposing lateral directions;
    an edge termination region surrounding the active region;
    a semiconductor body having a frontside and a backside, a thickness of the semiconductor body being defined as the distance along a vertical direction between the frontside and the backside, wherein a total lateral extension of the transition section amounts to at least 30% of the semiconductor body thickness;
    a plurality of trenches arranged in each of the IGBT section, the diode section and the transition section, each trench extending from the frontside along the vertical direction into the semiconductor body and comprising a trench electrode isolated from the semiconductor body by a trench insulator, wherein two adjacent trenches define a respective mesa portion in the semiconductor body;
    a first load terminal at the semiconductor body frontside and a second load terminal at the semiconductor body backside, wherein the IGBT section is configured for conduction of a forward load current between the first load terminal and the second load terminal, and wherein the diode section is configured for conduction of a reverse load current between the first load terminal and the second load terminal;
    a control terminal configured to control the forward load current, wherein in the IGBT section, an average density of trench electrodes electrically connected to the control terminal is at least twice as great as an average density of trench electrodes connected to the control terminal in the transition section;
    a drift region of a first conductivity type formed in the semiconductor body and extending into each of the IGBT section, the diode section and the transition section; and
    a body region of a second conductivity type formed in the mesa portions of the semiconductor body and extending into each of the IGBT section, the diode section and the transition section,
    wherein at least portions of the body region are electrically connected to the first load terminal,
    wherein the body region forms pn-junctions to subsections of the mesa portions of the first conductivity type at least in the transition section,
    wherein at least in the transition section, a barrier region of the first conductivity type having a peak dopant concentration at least 100 times greater than an average dopant concentration of the drift region is arranged at least in subportions of the mesa portion that interface with the body region,
    wherein an average dopant dose of the mesa subportions of the first conductivity type in the transition section is at least a factor of 1.2 higher than an average dopant dose of mesa subportions of the first conductivity type in the diode section.

2. The RC IGBT of claim 1, wherein with respect to a volume of the active region, a ratio between the IGBT section and the diode section is at least 2:1.

3. The RC IGBT of claim 1, wherein at least a part of the body region in the IGBT section is coupled to the drift region without the barrier region, and/or wherein at least a part of the body region in the diode section is coupled to the drift region without the barrier region.

4. The RC IGBT of claim 1, wherein the average dopant dose of the mesa subportions in the IGBT section is at least a factor of 1.2 lower than the average dopant dose of mesa subportions in the transition section.

5. The RC IGBT of claim 1, wherein at least one of the average dopant dose of the mesa subportions in the IGBT section, the average dopant dose of the mesa subportions in the diode section and the average dopant dose of the mesa subportions in the transition section is achieved at least by a lateral structure of a barrier layer comprising the barrier region.

6. The RC IGBT of claim 1, wherein the average dopant dose of the barrier region amounts at least to 20% and to no more than 500% of the average dopant dose of the body region in the transition section.

7. The RC IGBT of claim 1, further comprising:
    in the IGBT section, an IGBT emitter region of the second conductivity type electrically connected to the second load terminal and coupled to the drift region.

8. The RC IGBT of claim 1, further comprising:
    in the diode section, a diode cathode region of the first conductivity type electrically connected to the second load terminal and coupled to the drift region.

9. The RC IGBT of claim 1, wherein each of the trenches that extend into the transition section is either electrically floating or electrically connected to a potential different from the electrical potential of the control terminal.

10. The RC IGBT of claim 1, wherein each of at least 80% of the trenches that extend into the transition section is either electrically floating or electrically connected to a potential different from the electrical potential of the control terminal, and wherein at least one of the remaining 20% of the trenches that extend into the transition section is electrically connected to the control terminal for forming at least one local IGBT cell in the transition section.

11. The RC IGBT of claim 10, wherein the barrier region in the transition section is laterally structured such that no lateral overlap between the barrier region and the at least one local IGBT cell in the transition section is formed.

12. The RC IGBT of claim 1, wherein the trenches in each of the IGBT section, the diode section and the transition section are laterally arranged next to one another in accordance with a same lateral trench pitch.

13. The RC IGBT of claim 12, wherein the lateral trench pitch defines a lateral distance between two adjacent trenches of no more than $\frac{1}{30}$ of the semiconductor body thickness.

14. The RC IGBT of claim 1, further comprising:
    in the diode section, a further barrier region of the first conductivity having an average dopant concentration at least 100 times as great as an average dopant concentration of the drift region and laterally extending along at least 10% of the total lateral extension of the diode section,
wherein at least a part of the body region in the diode section is coupled to the drift region at least by the further barrier region.

15. The RC IGBT of claim 14, wherein the barrier region of the transition section forms a contiguous barrier layer with the further barrier region.

16. The RC IGBT of claim 1, further comprising:
in the IGBT section, a further barrier region of the first conductivity having a peak dopant concentration at least 100 times as great as an average dopant concentration of the drift region and laterally extending along at least 10% of the total lateral extension of the IGBT section,
wherein at least a part of the body region in the IGBT section is coupled to the drift region at least by the further barrier region.

17. The RC IGBT of claim 16, wherein the barrier region of the transition section forms a contiguous barrier layer with the further barrier region.

18. The RC IGBT of claim 1, further comprising:
in the transition section, a doped region electrically connected to the second load terminal and coupled to the drift region and having the same total lateral extension as the transition section.

19. The RC IGBT of claim 18, wherein:
the doped region is of the second conductivity type; or
the doped region is a hybrid region with a number of subregions of the first conductivity type electrically connected to the second load terminal and coupled to the drift region, and a number of second subregions of the second conductivity type electrically connected to the second load terminal and coupled to the drift region, or
the doped region is of the second conductivity type and the RC IGBT further comprises, in the diode section, a diode cathode region of the first conductivity type electrically connected to the second load terminal and coupled to the drift region, the diode cathode region being laterally interrupted by one or more subregions of the second conductivity type that are electrically connected to the second load terminal and coupled to the drift region.

20. The RC IGBT 18, wherein the doped region is of the second conductivity type, wherein the IGBT section comprises an IGBT emitter region of the second conductivity type electrically connected to the second load terminal and coupled to the drift region, and wherein:
the IGBT emitter region is a laterally structured region with a number of higher doped IGBT emitter subregions of the second conductivity type electrically connected to the second load terminal and coupled to the drift region, and with a number of lower doped IGBT emitter subregions of the second conductivity type electrically connected to the second load terminal and coupled to the drift region; and/or
the doped region is a laterally structured region with a number of higher doped subregions of the second conductivity type electrically connected to the second load terminal and coupled to the drift region, and with a number of lower doped subregions of the second conductivity type electrically connected to the second load terminal and coupled to the drift region.

21. The RC IGBT of claim 1, wherein:
the body region of the diode section extends further along the vertical direction as compared to the body region in the IGBT section by a factor of at least 150% compared to a deepest level of the body region in the IGBT section along the vertical direction; and/or
the barrier region of the transition section and the body region of the diode section have a common vertical extension range amounting to at least 20% of the total vertical extension range of the barrier region.

22. A method of forming an RC IGBT, the method comprising:
forming an active region with an IGBT section, a diode section and a transition section between the IGBT section and the diode section, wherein the IGBT section and the diode section adjoin the transition section from opposing lateral directions;
forming an edge termination region surrounding the active region;
forming a semiconductor body having a frontside and a backside, a thickness of the semiconductor body being defined as the distance along a vertical direction between the frontside and the backside, wherein a total lateral extension of the transition section amounts to at least 30% of the semiconductor body thickness;
forming a plurality of trenches arranged in each of the IGBT section, the diode section and the transition section, each trench extending from the frontside along the vertical direction into the semiconductor body and comprising a trench electrode isolated from the semiconductor body by a trench insulator, wherein two adjacent trenches define a respective mesa portion in the semiconductor body;
forming a first load terminal at the semiconductor body frontside and a second load terminal at the semiconductor body backside, wherein the IGBT section is configured for conduction of a forward load current between the first load terminal and the second load terminal, wherein the diode section is configured for conduction of a reverse load current between the first load terminal and the second load terminal;
forming a control terminal configured to control the forward load current, wherein in the IGBT section, an average density of trench electrodes electrically connected to the control terminal is at least twice as great as an average density of trench electrodes connected to the control terminal in the transition section;
forming a drift region of a first conductivity type in the semiconductor body and extending into each of the IGBT section, the diode section and the transition section;
forming a body region of a second conductivity type in the mesa portions of the semiconductor body and extending into each of the IGBT section, the diode section and the transition section, wherein at least portions of the body region are electrically connected to the first load terminal, and wherein the body region forms pn-junctions to subsections of the mesa portions of the first conductivity type of the first conductivity type at least in the transition section; and
forming at least in the transition section, a barrier region of the first conductivity type having a peak dopant concentration at least 100 times greater than an average dopant concentration of the drift region and arranged at least in subportions of the mesa portion that interface with the body region, wherein an average dopant dose of the mesa subportions of the first conductivity type in the transition section is at least a factor of 1.2 higher than an average dopant dose of mesa subportions of the first conductivity type in the diode section.

* * * * *

UNITED STATES PATENT AND TRADEMARK OFFICE
CERTIFICATE OF CORRECTION

| | |
|---|---|
| PATENT NO. | : 11,398,472 B2 |
| APPLICATION NO. | : 17/016498 |
| DATED | : July 26, 2022 |
| INVENTOR(S) | : J. Laven et al. |

It is certified that error appears in the above-identified patent and that said Letters Patent is hereby corrected as shown below:

In the Claims

Column 28, Lines 57 & 58 (Claim 22), please change "of the first conductivity type of the first conductivity type" to -- of the first conductivity type --.

Signed and Sealed this
First Day of August, 2023

Katherine Kelly Vidal
*Director of the United States Patent and Trademark Office*